US011901266B2

(12) United States Patent
Yang et al.

(10) Patent No.: US 11,901,266 B2
(45) Date of Patent: Feb. 13, 2024

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Ting-Li Yang, Tainan (TW); Wen-Hsiung Lu, Tainan (TW); Lung-Kai Mao, Kaohsiung (TW); Fu-Wei Liu, Tainan (TW); Mirng-Ji Lii, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

(21) Appl. No.: 17/460,709

(22) Filed: Aug. 30, 2021

(65) Prior Publication Data

US 2023/0060982 A1    Mar. 2, 2023

(51) Int. Cl.
*H01L 21/30*    (2006.01)
*H01L 23/48*    (2006.01)
*H01L 21/306*    (2006.01)
*H01L 21/768*    (2006.01)

(52) U.S. Cl.
CPC ...... *H01L 23/481* (2013.01); *H01L 21/30608* (2013.01); *H01L 21/76871* (2013.01)

(58) Field of Classification Search
CPC ......... H01L 21/76871; H01L 21/30608; H01L 23/481
See application file for complete search history.

(56) References Cited

U.S. PATENT DOCUMENTS

| | | | | |
|---|---|---|---|---|
| 2012/0298413 | A1* | 11/2012 | Mori | H01L 23/147 29/829 |
| 2012/0322261 | A1* | 12/2012 | Shue | H01L 21/76846 257/E21.585 |
| 2013/0252416 | A1* | 9/2013 | Takeda | H01L 23/481 438/630 |
| 2014/0141569 | A1* | 5/2014 | Jo | H01L 24/94 438/109 |
| 2016/0233167 | A1* | 8/2016 | Shimizu | H01L 21/486 |
| 2016/0276272 | A1* | 9/2016 | Chen | H01L 23/53295 |
| 2016/0293484 | A1* | 10/2016 | Lee | H01L 23/522 |
| 2021/0066123 | A1* | 3/2021 | Hwang | H01L 23/481 |

* cited by examiner

*Primary Examiner* — Jay C Chang
*Assistant Examiner* — Siangluai Mang
(74) *Attorney, Agent, or Firm* — Birch, Stewart, Kolasch & Birch, LLP

(57) ABSTRACT

A method for forming a semiconductor device structure is provided. The method includes providing a chip structure including a substrate and a wiring structure over a first surface of the substrate. The method includes removing a first portion of the wiring structure adjacent to the hole to widen a second portion of the hole in the wiring structure. The second portion has a first width increasing in a first direction away from the substrate. The method includes forming a first seed layer over the wiring structure and in the hole. The method includes thinning the substrate from a second surface of the substrate until the first seed layer in the hole is exposed. The method includes forming a second seed layer over the second surface of the substrate and the first seed layer in the hole.

20 Claims, 27 Drawing Sheets

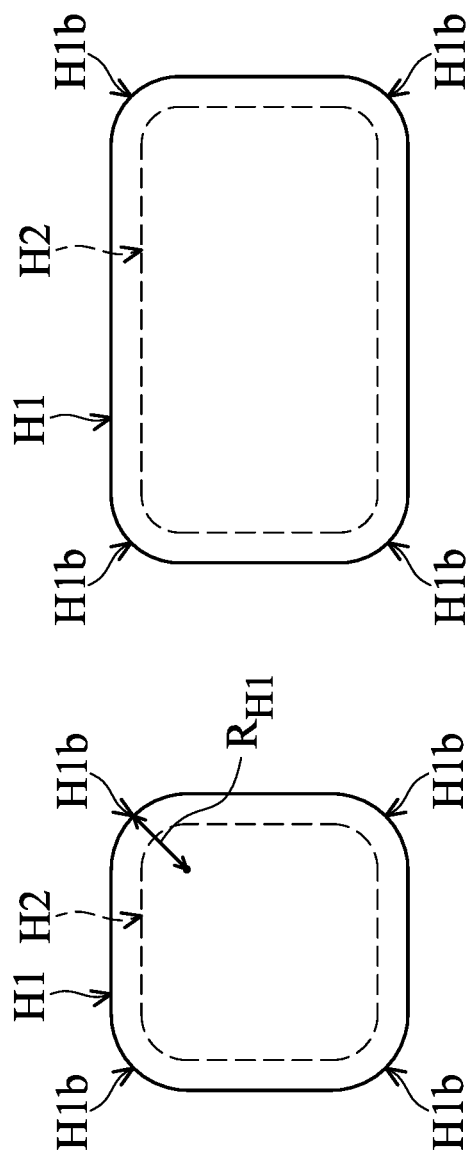
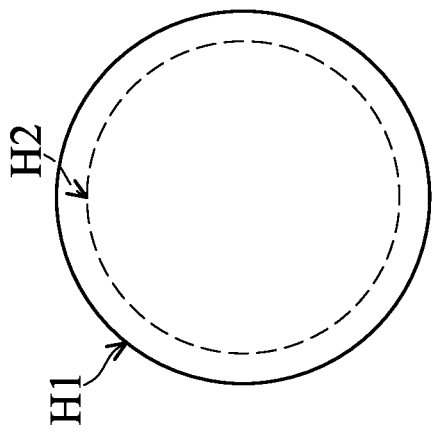
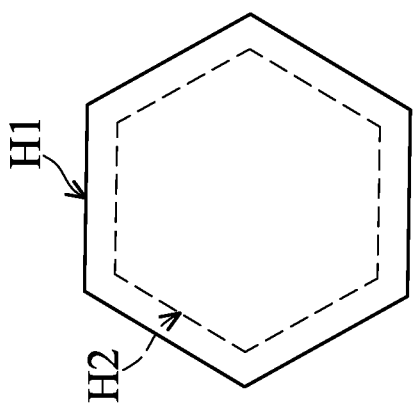
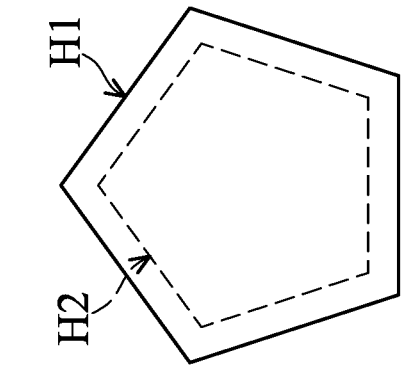
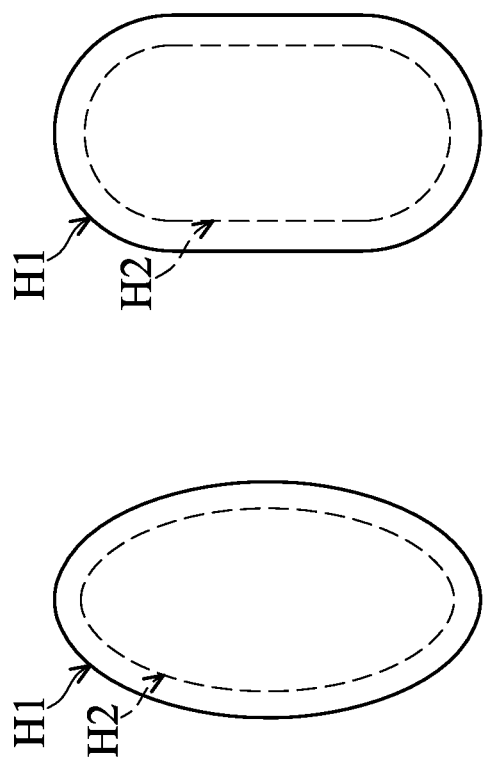
FIG. 1R-1  FIG. 1R-2  FIG. 1R-3  FIG. 1R-4  FIG. 1R-5  FIG. 1R-6  FIG. 1R-7

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes. It is hard to maintain an acceptable electrical quality of conductive elements of the semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1R-1 is a top view of a first enlarged portion and a neck portion of a hole of a chip structure of the semiconductor device structure in a region of FIG. 1R, in accordance with some embodiments.

FIG. 1R-2 is a top view of a first enlarged portion and a neck portion of a hole of a chip structure of the semiconductor device structure in a region of FIG. 1R, in accordance with some embodiments.

FIG. 1R-3 is a top view of a first enlarged portion and a neck portion of a hole of a chip structure of the semiconductor device structure in a region of FIG. 1R, in accordance with some embodiments.

FIG. 1R-4 is a top view of a first enlarged portion and a neck portion of a hole of a chip structure of the semiconductor device structure in a region of FIG. 1R, in accordance with some embodiments.

FIG. 1R-5 is a top view of a first enlarged portion and a neck portion of a hole of a chip structure of the semiconductor device structure in a region of FIG. 1R, in accordance with some embodiments.

FIG. 1R-6 is a top view of a first enlarged portion and a neck portion of a hole of a chip structure of the semiconductor device structure in a region of FIG. 1R, in accordance with some embodiments.

FIG. 1R-7 is a top view of a first enlarged portion and a neck portion of a hole of a chip structure of the semiconductor device structure in a region of FIG. 1R, in accordance with some embodiments.

FIG. 1R-8 is a bottom view of a second enlarged portion of a hole of a chip structure of the semiconductor device structure in a region of FIG. 1R, in accordance with some embodiments.

FIG. 1R-9 is a bottom view of a second enlarged portion of a hole of a chip structure of the semiconductor device structure in a region of FIG. 1R, in accordance with some embodiments.

FIG. 1R-10 is a bottom view of a second enlarged portion of a hole of a chip structure of the semiconductor device structure in a region of FIG. 1R, in accordance with some embodiments.

FIG. 1R-11 is a bottom view of a second enlarged portion of a hole of a chip structure of the semiconductor device structure in a region of FIG. 1R, in accordance with some embodiments.

FIG. 2 is a cross-sectional view of a semiconductor device structure, in accordance with some embodiments.

FIG. 3 is a cross-sectional view of a semiconductor device structure, in accordance with some embodiments.

FIG. 4 is a cross-sectional view of a semiconductor device structure, in accordance with some embodiments.

FIG. 5 is a cross-sectional view of a semiconductor device structure, in accordance with some embodiments.

FIG. 6 is a cross-sectional view of a semiconductor device structure, in accordance with some embodiments.

FIG. 7 is a cross-sectional view of a semiconductor device structure, in accordance with some embodiments.

FIG. 8 is a cross-sectional view of a stage of a process for forming a semiconductor device structure, in accordance with some embodiments.

DETAILED DESCRIPTION

Figure 1A:
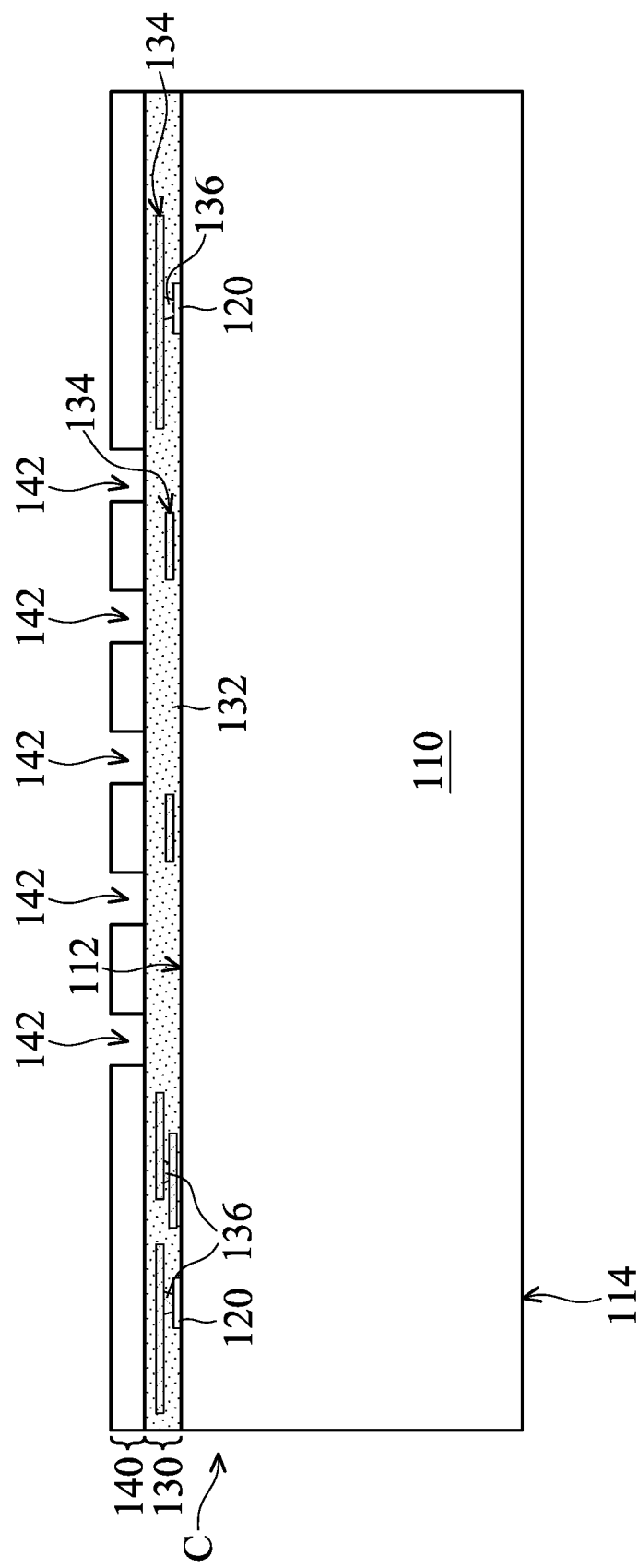
FIGS. 1A-1R are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments, the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
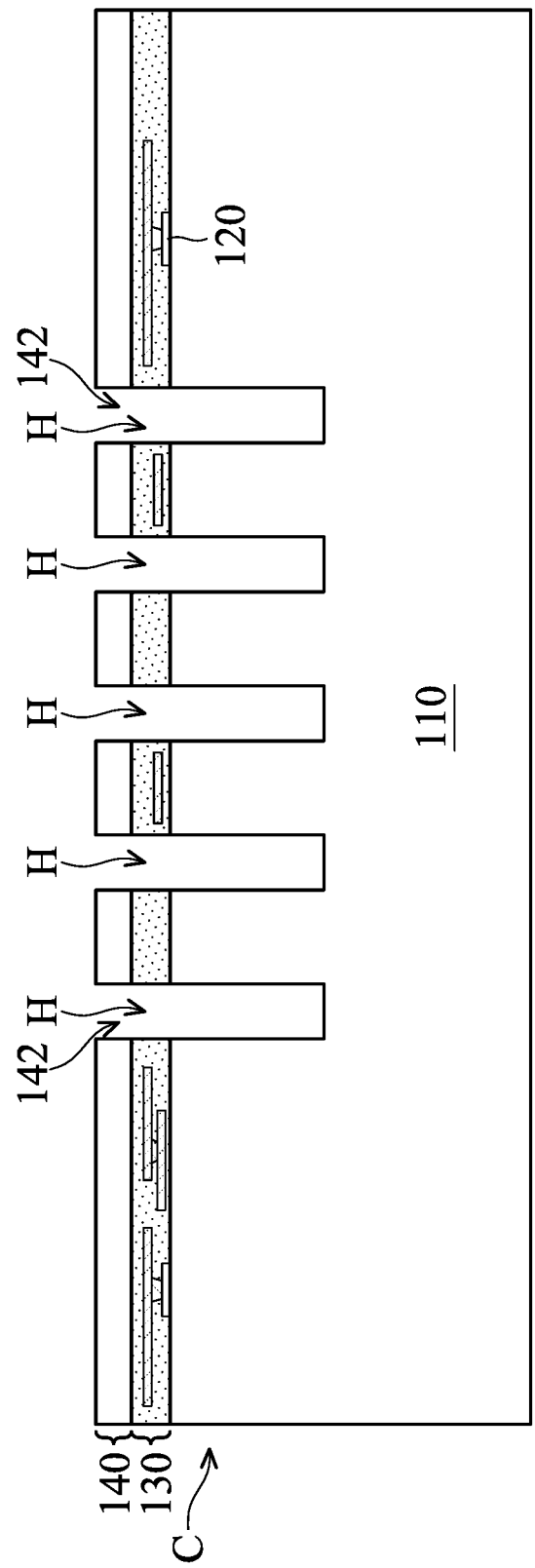
Figure 1C:
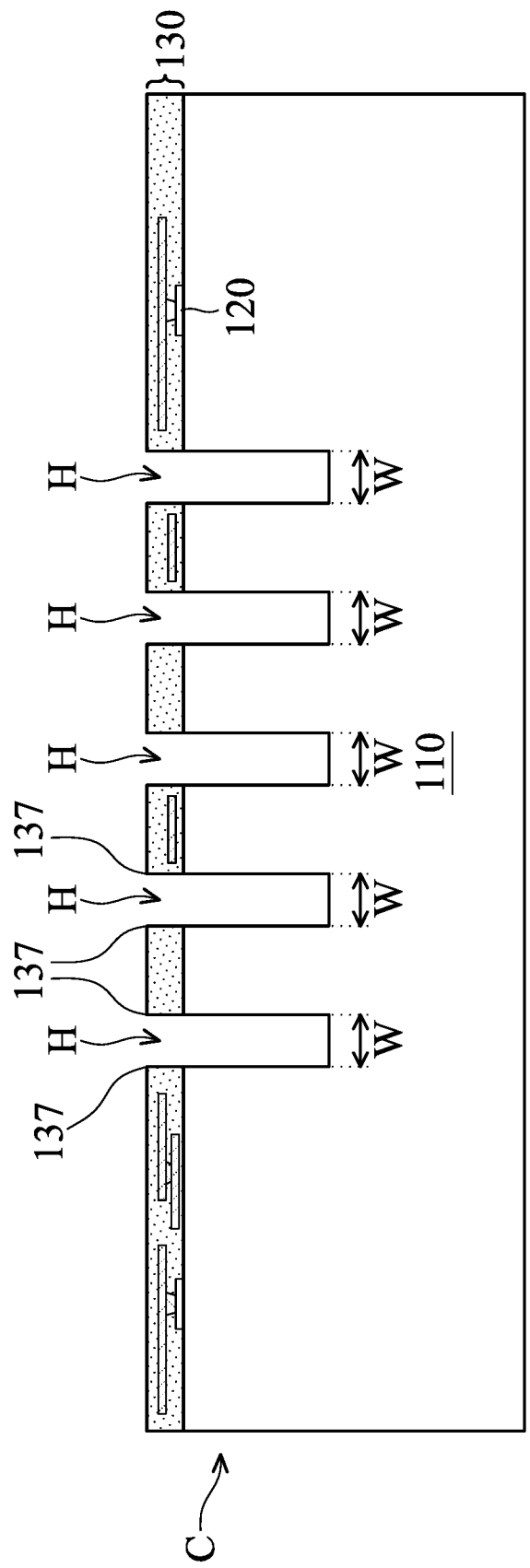
Figure 1D:
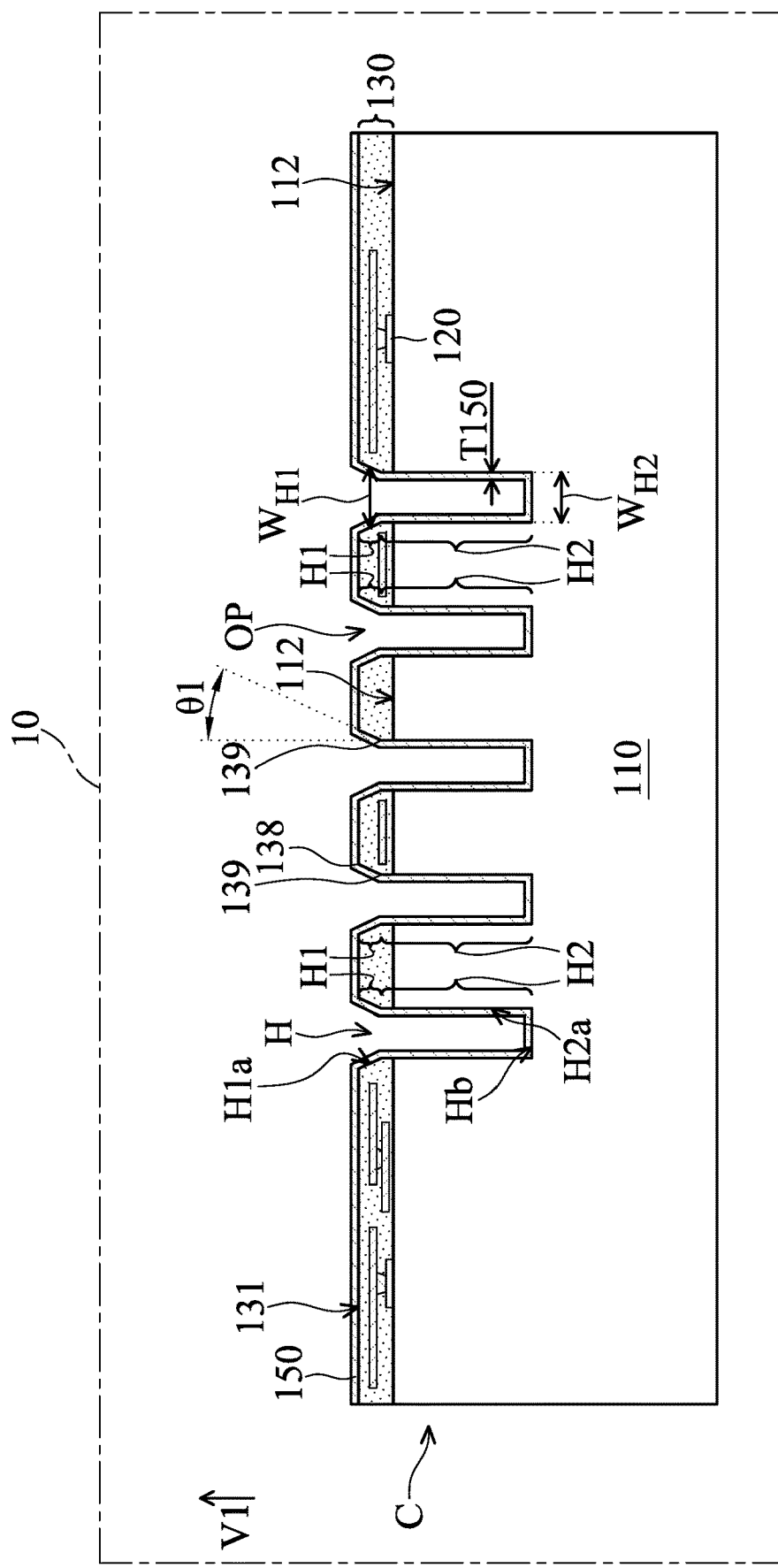
Figure 1E:
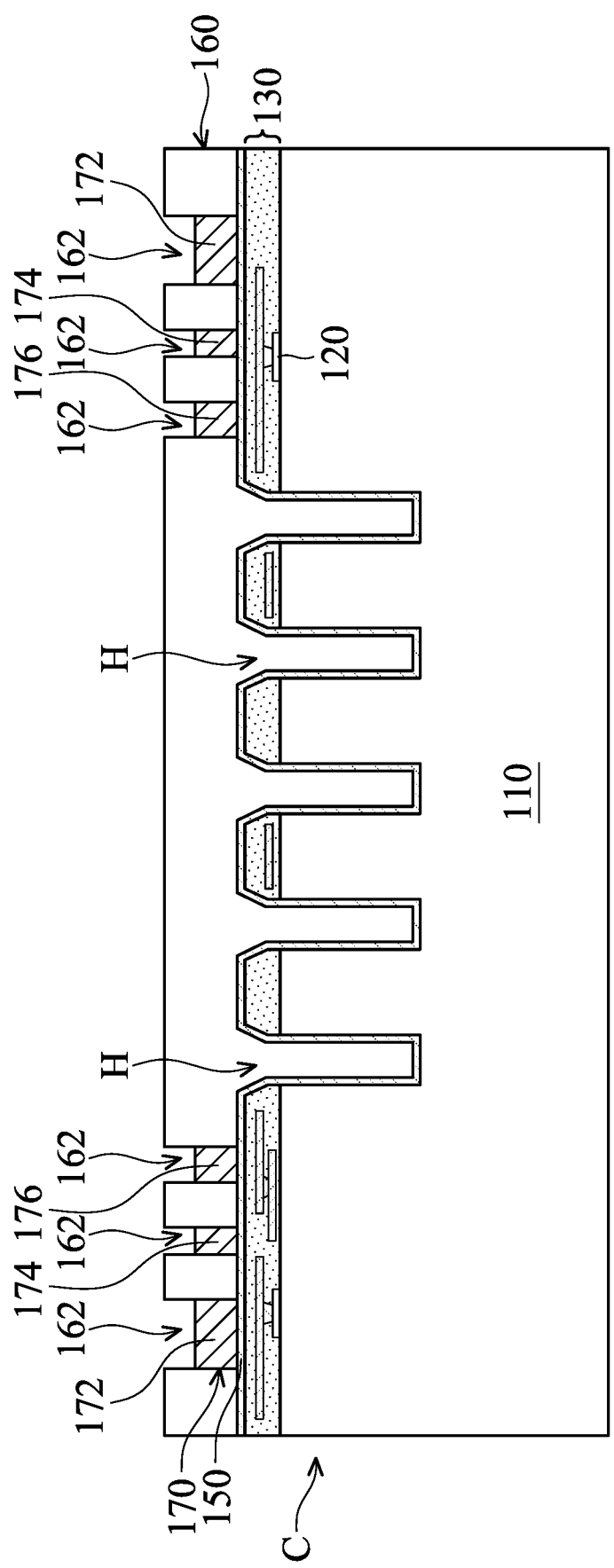
Figure 1F:
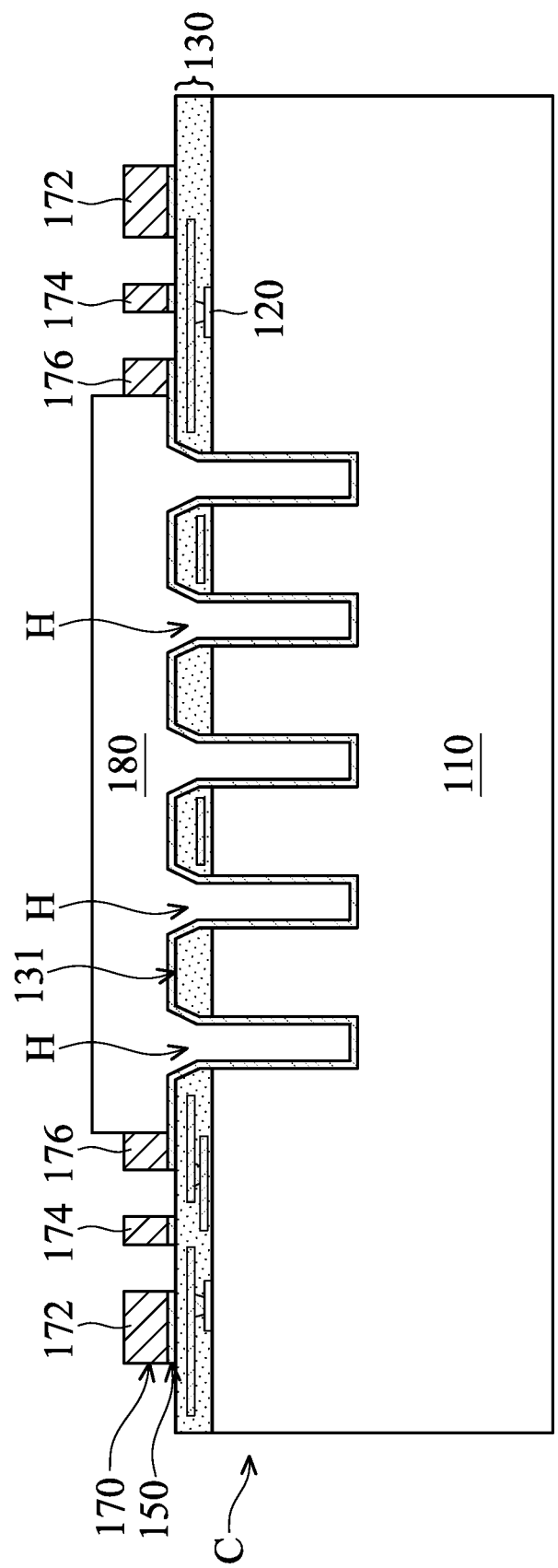
Figure 1G:
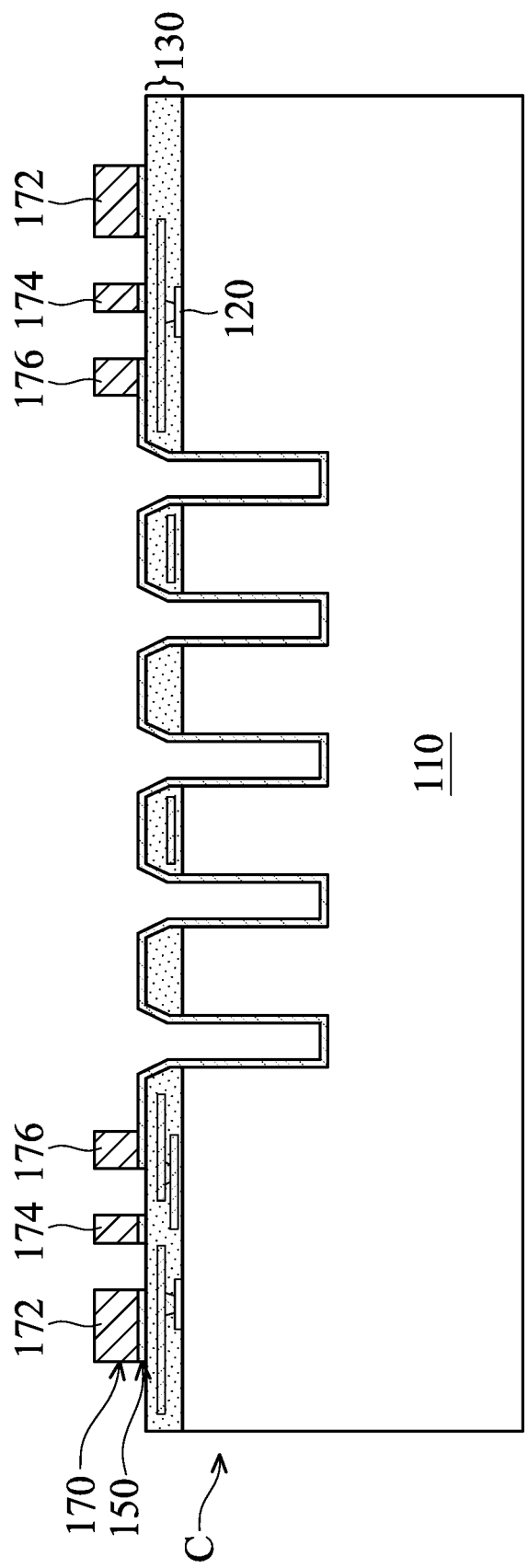
Figure 1H:
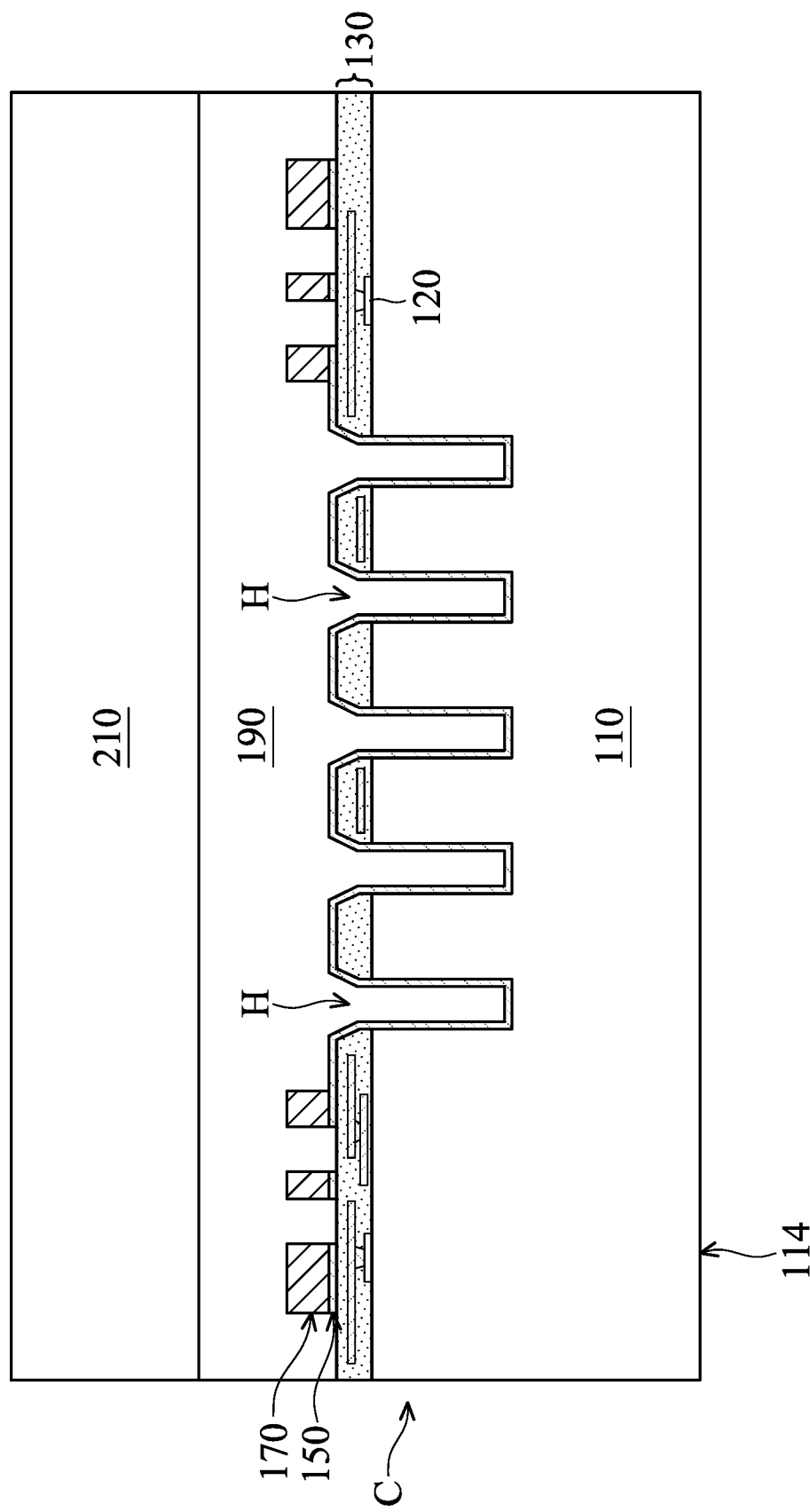
Figure 1I:
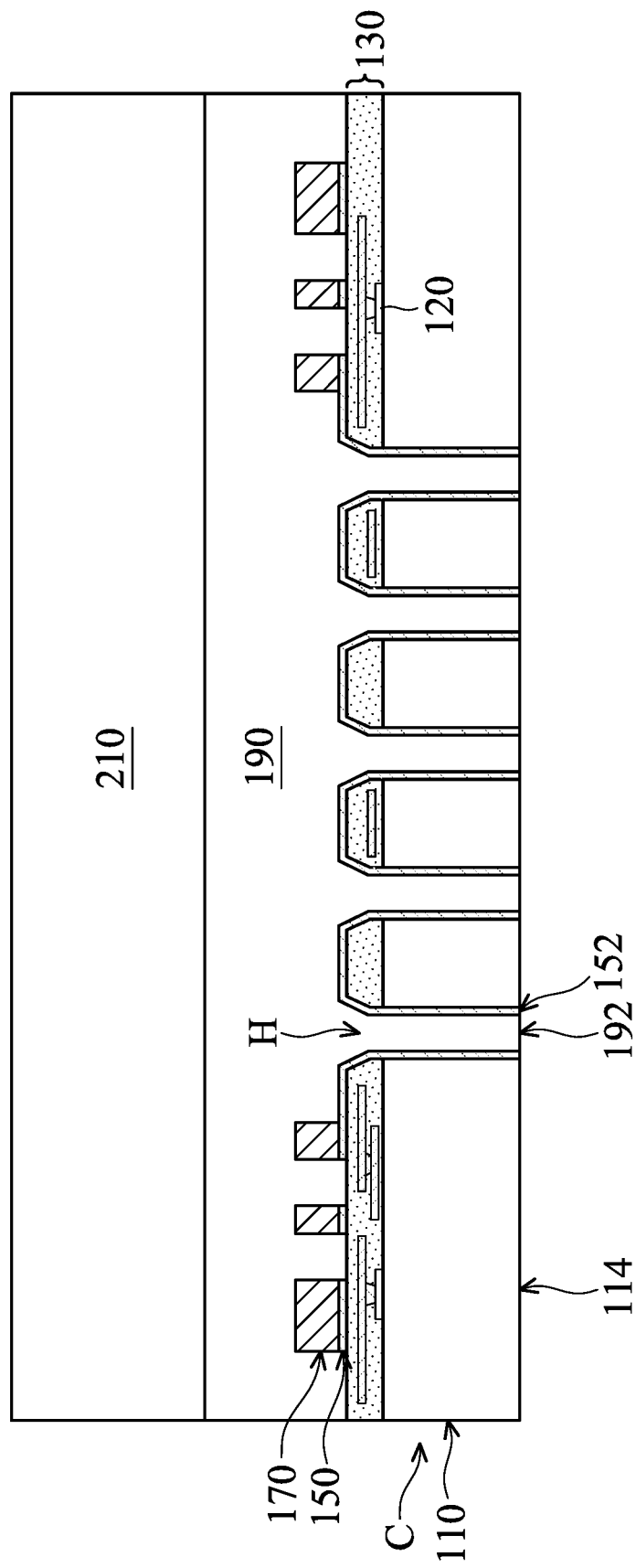
Figure 1J:
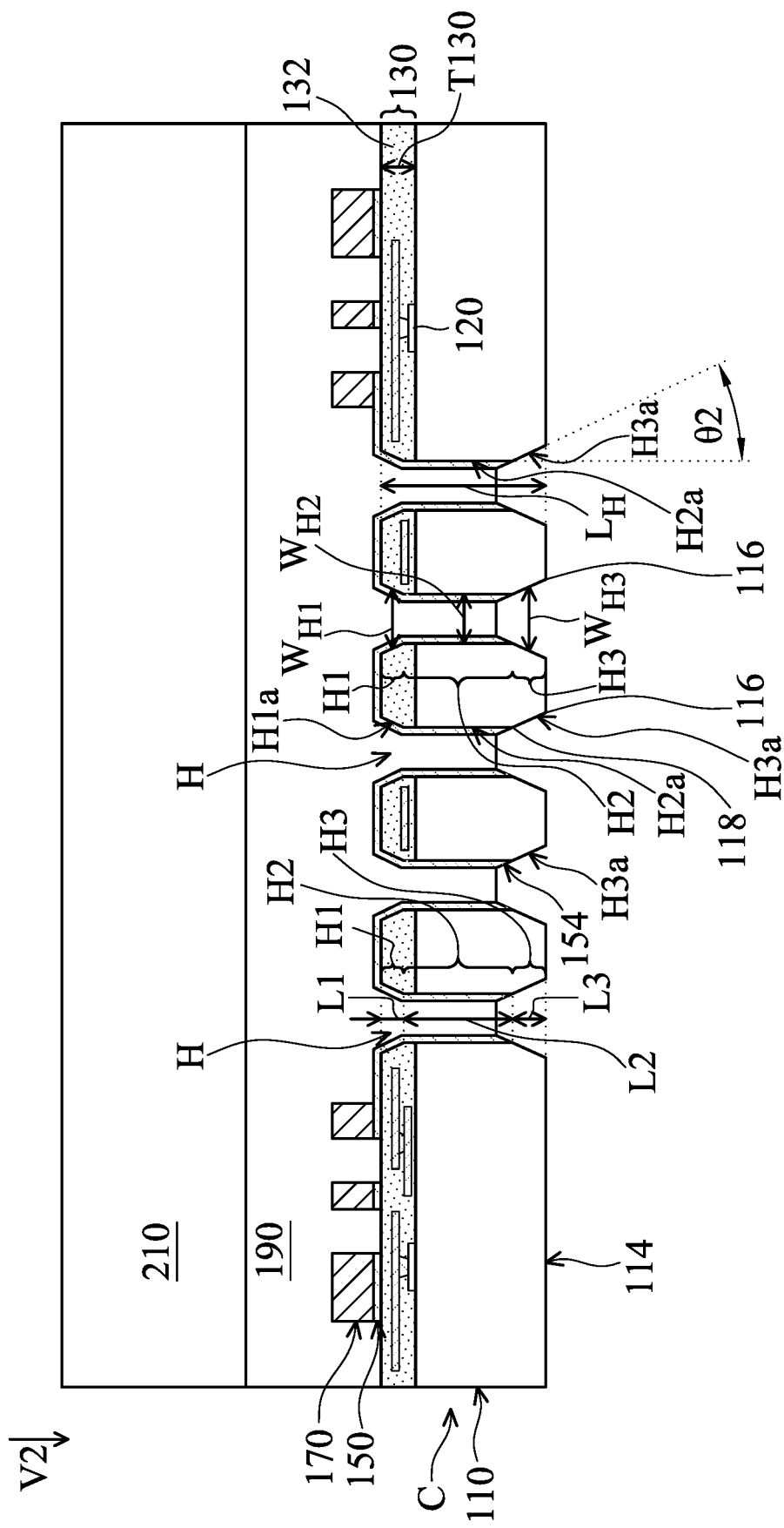
Figure 1K:
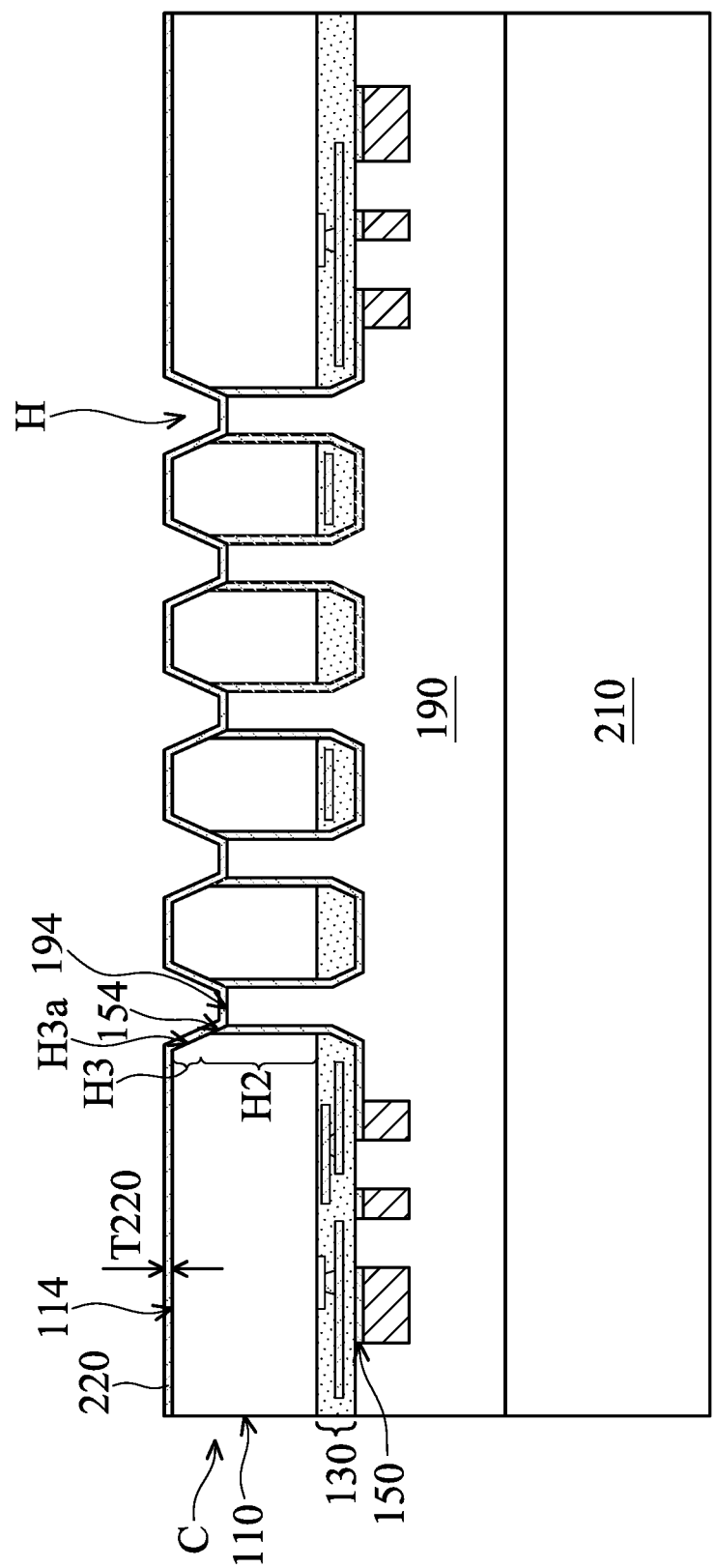
Figure 1L:
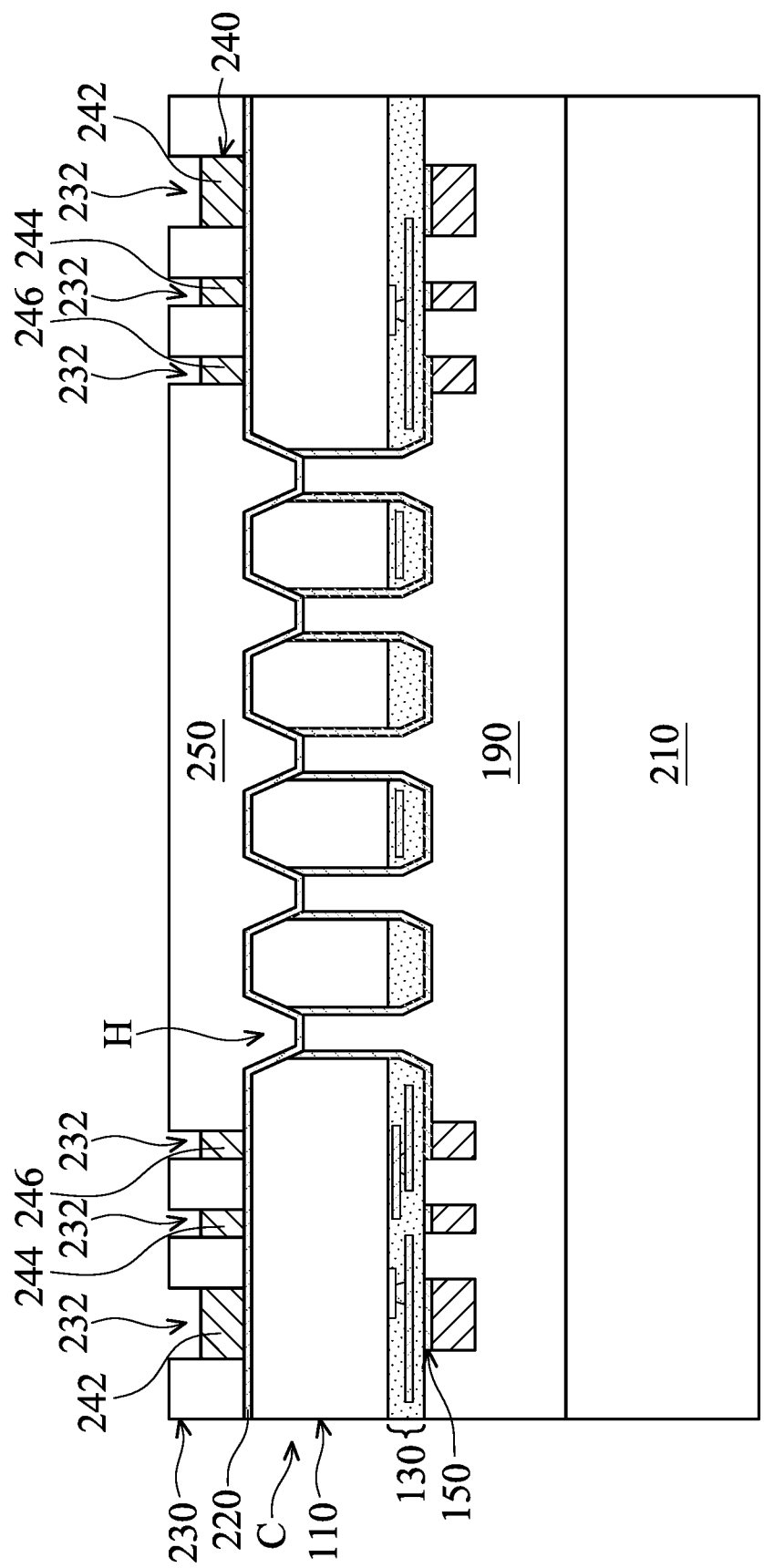
Figure 1M:
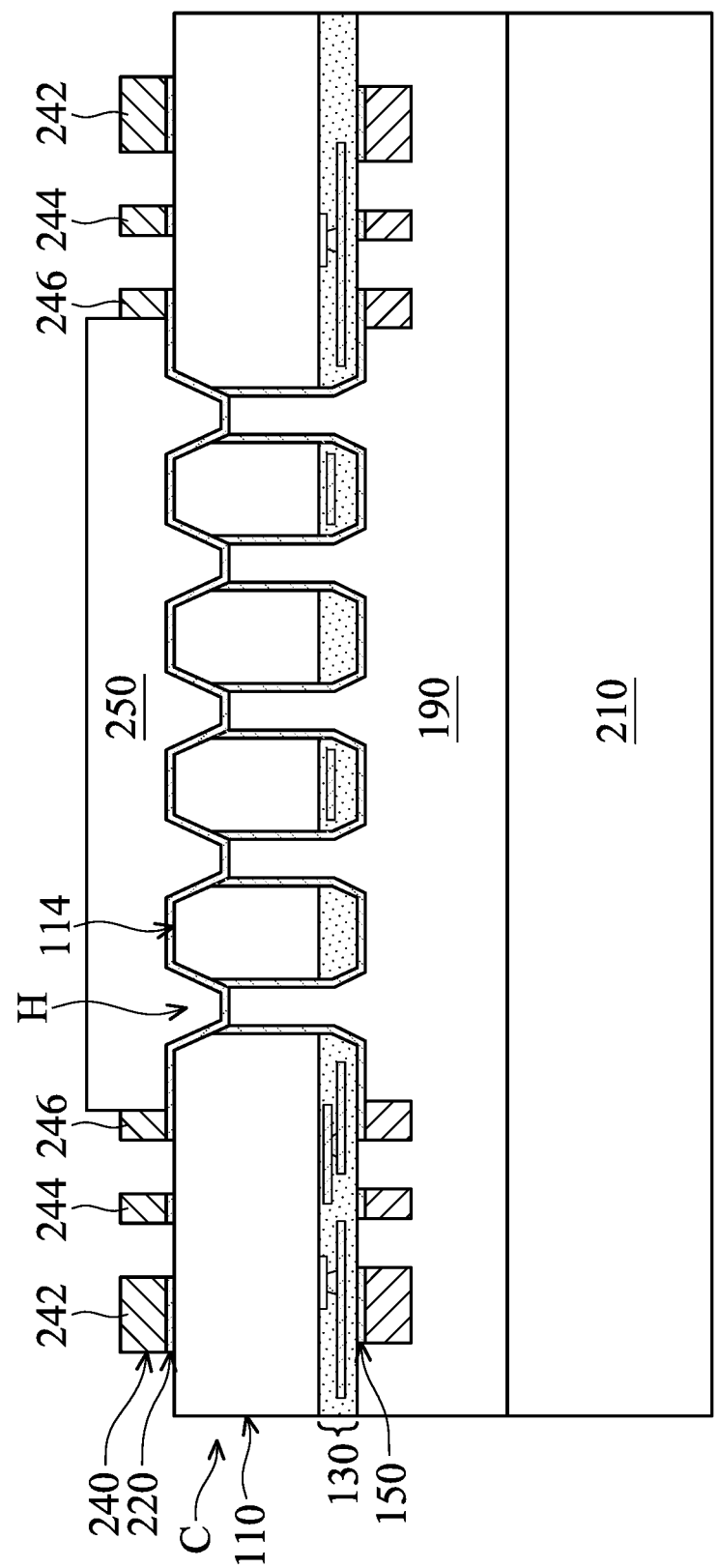
Figure 1N:
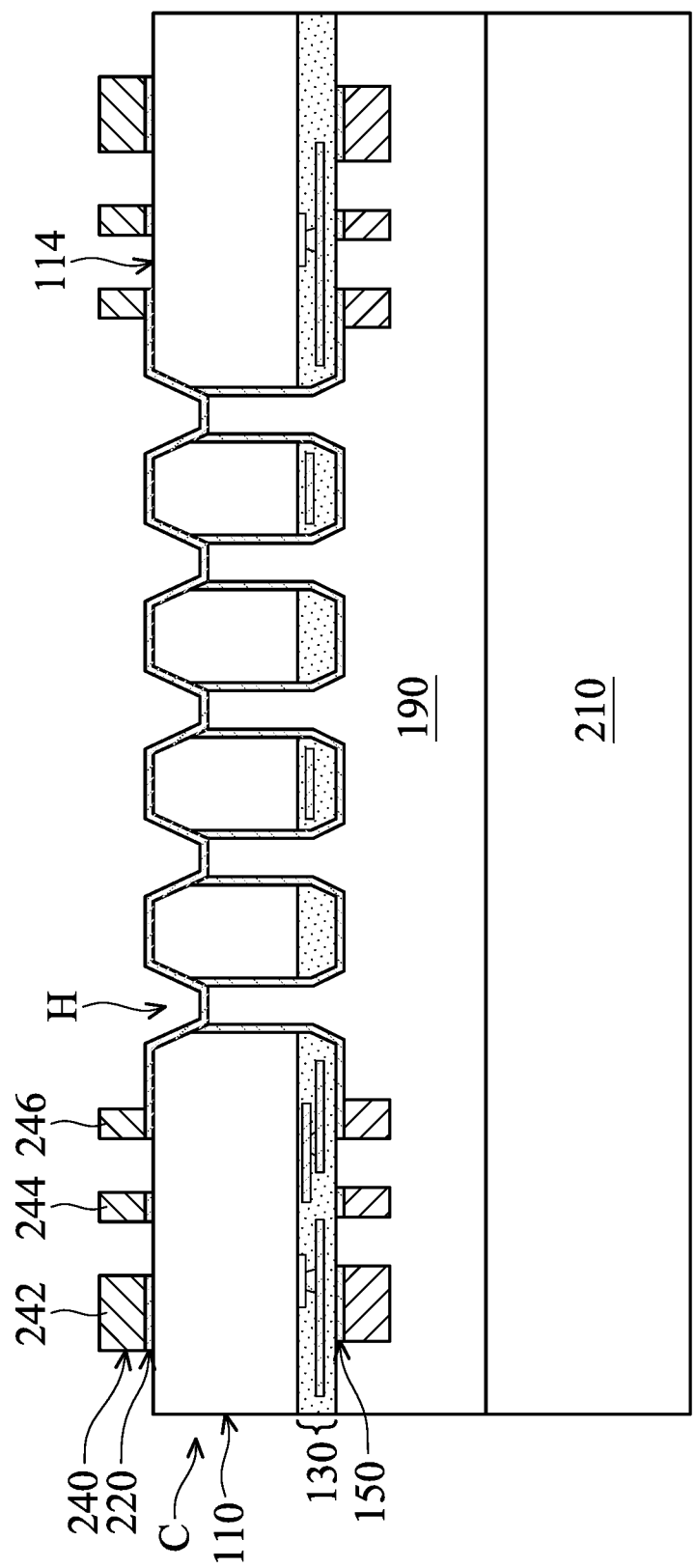
Figure 1O:
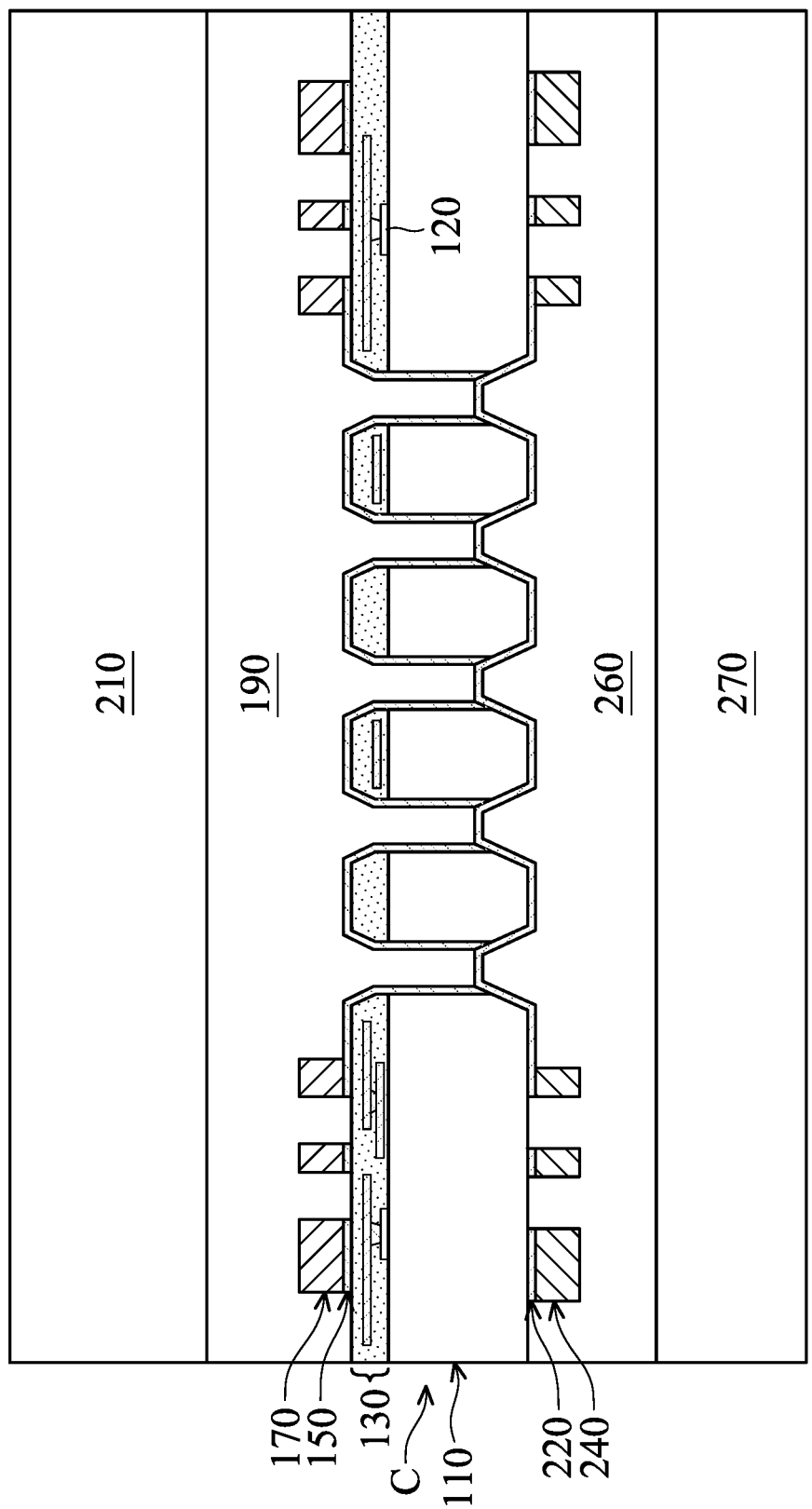
Figure 1P:
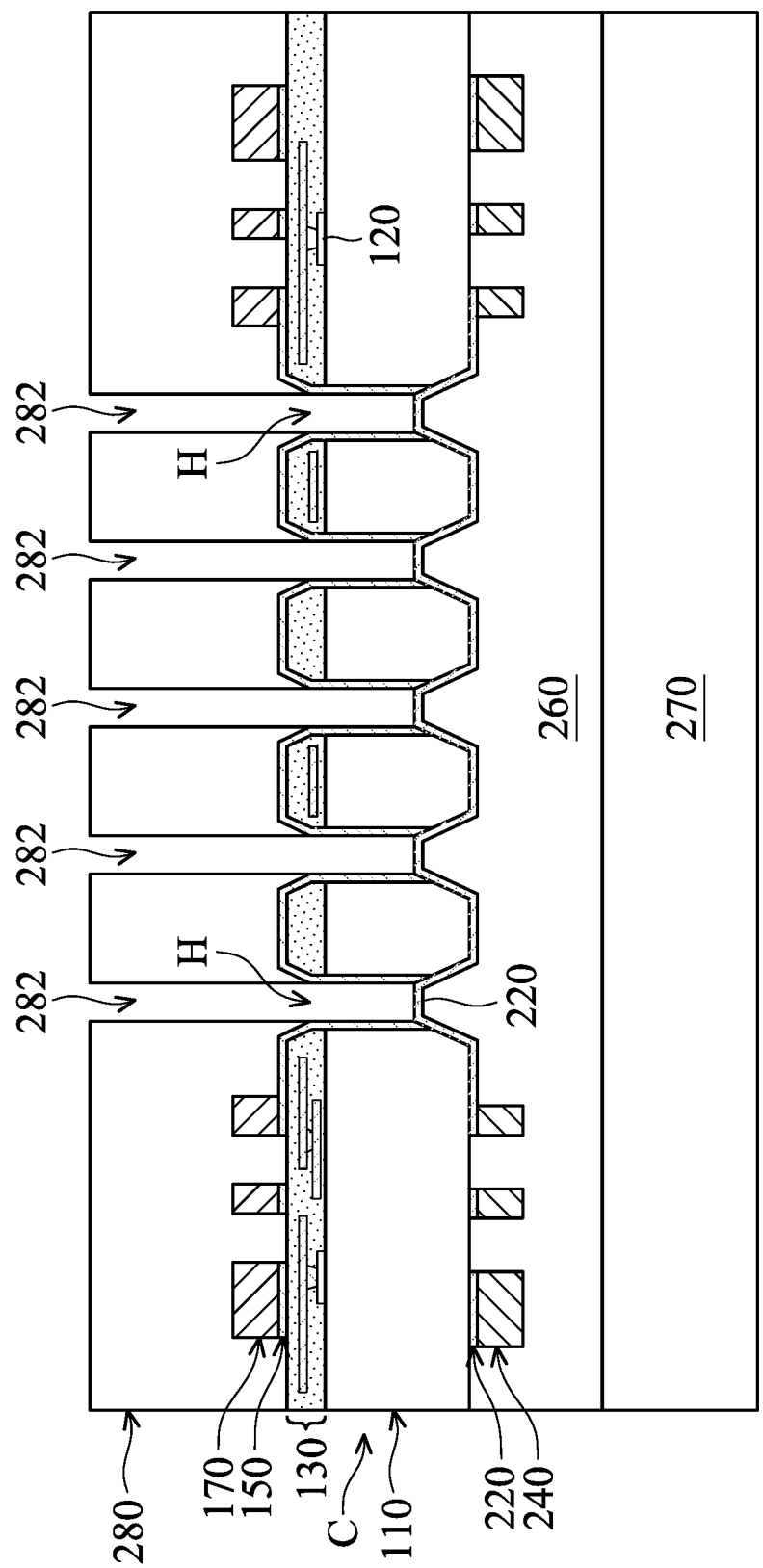
Figure 1Q:
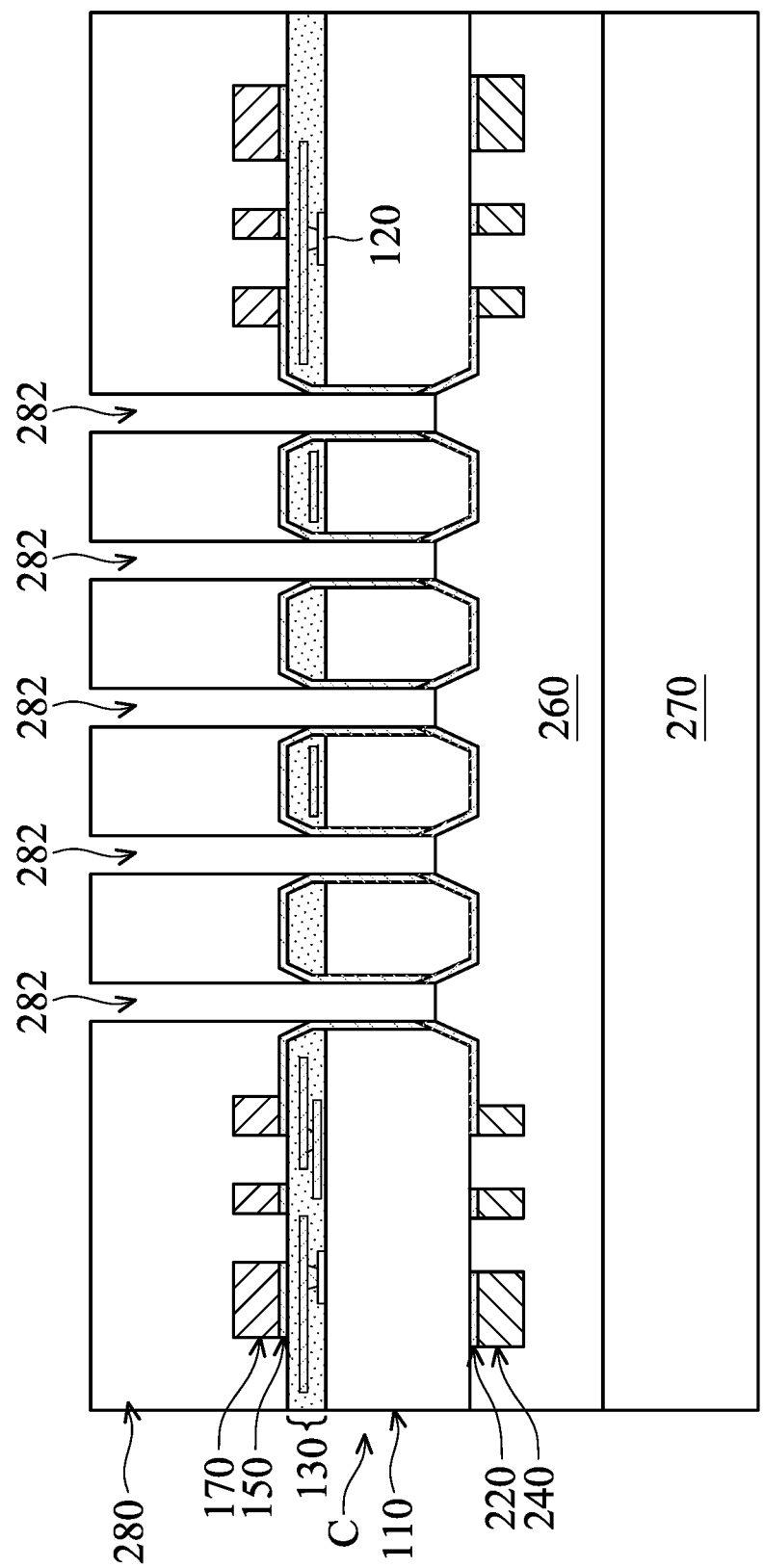
Figure 1R:
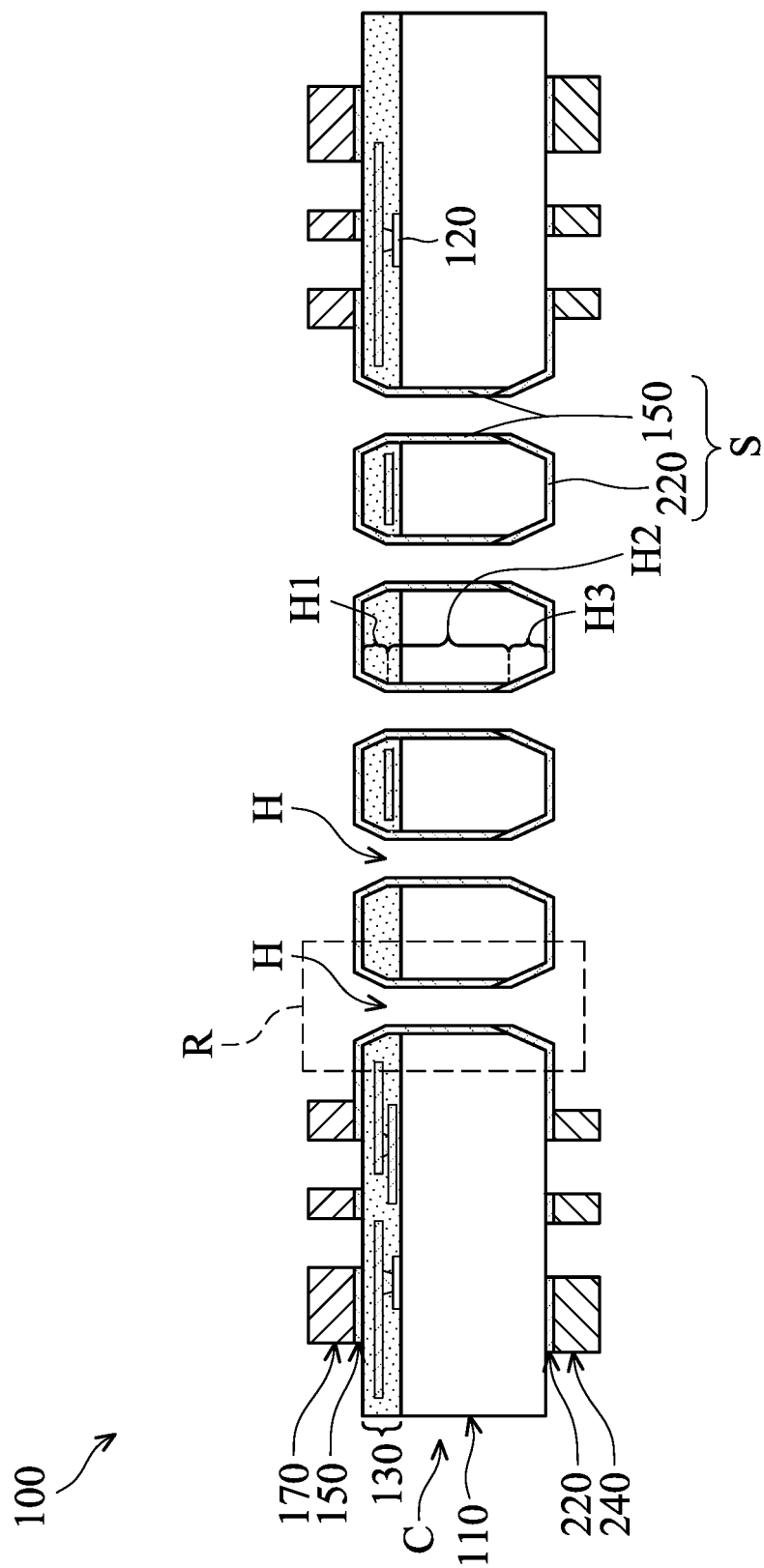

FIGS. 1A-1R are cross-sectional views of various stages of a process for forming a semiconductor device structure, in accordance with some embodiments. As shown in FIG. 1A, a substrate 110 is provided, in accordance with some embodiments. The substrate 110 has two opposite surfaces 112 and 114, in accordance with some embodiments. The substrate 110 includes, for example, a semiconductor wafer (such as a silicon wafer), a portion of a semiconductor wafer, or a chip.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the various device elements 120 are formed in and/or over the substrate 110. Examples of the various device elements 120 include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements 120. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements 120 formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, a wiring structure 130 is formed over the surface 112 of the substrate 110, in accordance with some embodiments. The substrate 110, the device elements 120, and the wiring structure 130 together form a chip structure C, in accordance with some embodiments. The wiring structure 130 is in direct contact with the substrate 110, in accordance with some embodiments. The wiring structure 130 includes a dielectric structure 132, wiring layers 134, and conductive vias 136, in accordance with some embodiments.

The dielectric structure 132 is formed over the surface 112 of the substrate 110, in accordance with some embodiments. The wiring layers 134 and conductive vias 136 are formed in the dielectric structure 132, in accordance with some embodiments. The conductive vias 136 are electrically connected between different wiring layers 134 and between the wiring layer 134 and the device elements 120, in accordance with some embodiments.

The dielectric structure 132 is made of an oxide-containing material (e.g. silicon oxide or undoped silicate glass) or another suitable insulating material, in accordance with some embodiments. The dielectric structure 132 is made of a material different from that of the substrate 110, in accordance with some embodiments. The wiring layers 134 and the conductive vias 136 are made of conductive materials such as metal (e.g., aluminum, copper or tungsten) or alloys thereof, in accordance with some embodiments.

As shown in FIG. 1A, a mask layer 140 is formed over the wiring structure 130, in accordance with some embodiments. The mask layer 140 has openings 142, in accordance with some embodiments. The openings 142 expose portions of the wiring structure 130, in accordance with some embodiments. The mask layer 140 is made of a polymer material, such as a photoresist material, in accordance with some embodiments.

As shown in FIG. 1B, portions of the chip structure C are removed through the openings 142 of the mask layer 140 to form holes H in the chip structure C, in accordance with some embodiments. The holes H penetrate through the wiring structure 130 and extend into the substrate 110, in accordance with some embodiments. In this step, the holes H do not penetrate through the substrate 110, in accordance with some embodiments.

As shown in FIG. 1C, the mask layer 140 is removed, in accordance with some embodiments. The holes H have widths W, in accordance with some embodiments. In some embodiments, the widths W are substantially equal to each other. In some other embodiments, the widths W are different from each other. The widths W are selected according to requirements, in accordance with some embodiments. The removal process includes an etching process, such as an anisotropic etching process (e.g., a dry etching process), in accordance with some embodiments.

As shown in FIGS. 1C and 1D, edge portions 137 of the wiring structure 130 adjacent to the holes H are removed to enlarge (or widen) openings OP of the holes H, and a seed layer 150 is formed over the wiring structure 130 and in the holes H, in accordance with some embodiments.

After the edge portions 137 are removed, each hole H has an enlarged portion H1 and a neck portion H2, in accordance with some embodiments. The enlarged portion H1 is closer to a top surface 131 of the wiring structure 130 than the neck portion H2, in accordance with some embodiments.

The enlarged portion H1 has a width $W_{H1}$ increasing in a direction V1 away from the substrate 110, in accordance with some embodiments. The width $W_{H1}$ ranges from about 3.5 µm to about 100 µm, in accordance with some embodiments. In some embodiments, a first difference between a maximum value and a minimum value of the width $W_{H1}$ ranges from about 0.5 µm to about 50 µm.

The enlarged portion H1 is wider than the neck portion H2, in accordance with some embodiments. That is, an average width of the enlarged portion H1 is greater than a width $W_{H2}$ of the neck portion H2, in accordance with some embodiments. The width $W_{H2}$ ranges from about 3 µm to about 50 µm, in accordance with some embodiments.

The enlarged portion H1 has sloped inner walls H1a, in accordance with some embodiments. The sloped inner walls H1a are, for example, planar surfaces. The neck portion H2 has steep inner walls H2a, in accordance with some embodiments. The steep inner wall H2a is steeper than the sloped inner wall H1a with respect to the surface 112 of the substrate 110 (or the top surface 131 of the wiring structure 130), in accordance with some embodiments.

In some embodiments, an angle θ1 between the steep inner wall H2a and the sloped inner wall H1a ranges from about 5' to about 85°. If the angle θ1 is less than 5°, the edge 138 of the wiring structure 130 may be too sharp to be uniformly covered by the seed layer 150. If the angle θ1 is greater than 85°, the edge 139 of the wiring structure 130 may be too sharp to be uniformly covered by the seed layer 150. The seed layer 150 has a thickness T150 ranging from about 0.3 µm to about 1 µm, in accordance with some embodiments.

The seed layer 150 is made of a conductive material, such as metal or alloys thereof (e.g., titanium, gold, and/or copper), in accordance with some embodiments. In some embodiments, the seed layer 150 is a single-layered structure. In some other embodiments, the seed layer 150 is a multi-layered structure including layers, which are made of different materials. For example, the seed layer 150 includes a titanium layer (not shown) and a gold layer (not shown) over the titanium layer.

In some embodiments, the removal process of the edge portions 137 of the wiring structure 130 and the formation of the seed layer 150 are performed using only one process, such as a sputtering process. The sputtering process includes a self-ionized plasma (SIP) sputtering process, in accordance with some embodiments. The direct current (DC) power of the SIP sputtering process ranges from about 35000 W to about 41000 W, in accordance with some embodiments.

The electron magnetic bottom inner magnet (EM BIM) power of the SIP sputtering process ranges from about 20 A to about 30 A, in accordance with some embodiments. The electron magnetic bottom outer magnet (EM BOM) power of the SIP sputtering process ranges from about −20 A to about −30 A, in accordance with some embodiments. The current direction of the EM BIM is opposite to the current direction of the EM BOM.

The removal process of the edge portions 137 of the wiring structure 130 and the formation of the seed layer 150 are performed in-situ, in accordance with some embodiments. That is, the removal process of the edge portions 137 and the formation of the seed layer 150 are performed in a same sputtering chamber 10, in accordance with some embodiments.

The removal process of the edge portions 137 and the formation of the seed layer 150 are performed simultaneously, in accordance with some embodiments. Specifically, in the sputtering process, a sputtered target material (which comes from a target) collides with the chip structure C to remove the edge portions 137 and to deposit over the chip structure C, in accordance with some embodiments. Therefore, the seed layer 150 is conformally deposited over the top surface 131 of the wiring structure 130, the sloped inner walls H1a of the enlarged portion H1, the steep inner walls H2a of the neck portion H2, and a bottom surface Hb of each hole H, in accordance with some embodiments.

Since the edge portions 137 may hinder the uniform deposition of the seed layer 150 in the holes H, the removal of the edge portions 137 may improve the step coverage uniformity of the seed layer 150 deposited in the holes H. Therefore, the seed layer 150 is able to be uniformly deposited in the holes H, in accordance with some embodiments.

As shown in FIG. 1E, the chip structure C is removed from the chamber 10, in accordance with some embodiments. As shown in FIG. 1E, a mask layer 160 is formed over the seed layer 150, in accordance with some embodiments. The mask layer 160 has trenches 162, in accordance with some embodiments. The trenches 162 expose portions of the seed layer 150, in accordance with some embodiments.

In some embodiments, the trenches 162 have different widths. In some other embodiments, the trenches 162 have substantially the same width. The widths of the trenches 162 are selected according to requirements, in accordance with some embodiments. The mask layer 160 is made of a polymer material, such as a photoresist material, in accordance with some embodiments.

As shown in FIG. 1E, conductive lines 172, 174, and 176 are formed in the trenches 162 and over the seed layer 150 exposed by the trenches 162, in accordance with some embodiments. The conductive lines 172, 174, and 176 together form a wiring layer 170, in accordance with some embodiments.

The conductive lines 172, 174, and 176 are made of a conductive material, such as metal (e.g., copper, aluminum, gold, silver, tungsten, titanium, cobalt, or ruthenium) or alloys thereof, in accordance with some embodiments. The conductive lines 172, 174, and 176 are formed by a plating process, such as an electroplating process, in accordance with some embodiments.

As shown in FIG. 1F, the mask layer 160 is removed, in accordance with some embodiments. As shown in FIG. 1F, a mask layer 180 is formed over portions of the seed layer 150, in accordance with some embodiments. The portions of the seed layer 150 includes a first portion in the holes H, a second portion between the holes H, and a third portion adjacent to the holes H, in accordance with some embodiments. The mask layer 180 is made of a polymer material, such as a photoresist material, in accordance with some embodiments.

As shown in FIG. 1F, the seed layer 150, which is not covered by the conductive lines 172, 174, and 176 and the mask layer 180, is removed, in accordance with some embodiments. The removal process includes an etching process, such as a dry etching process or a wet etching process, in accordance with some embodiments. As shown in FIG. 1G, the mask layer 180 is removed, in accordance with some embodiments.

As shown in FIG. 1H, an insulating layer 190 is formed over the seed layer 150, the wiring layer 170, and the wiring structure 130, in accordance with some embodiments. The insulating layer 190 is filled into the holes H, in accordance with some embodiments. The insulating layer 190 is made of an oxide-containing material, such as silicon oxide, in accordance with some embodiments. The insulating layer 190 is formed using a deposition process, such as a chemical vapor deposition process or a physical vapor deposition process, in accordance with some embodiments.

As shown in FIG. 1H, a carrier substrate 210 is bonded with the insulating layer 190, in accordance with some embodiments. The carrier substrate 210 is used to support the substrate 110 in subsequent processes, in accordance with some embodiments. The carrier substrate 210 is made of metal, glass, semiconductor material (e.g., silicon), polymer, the like, or another suitable material, in accordance with some embodiments.

As shown in FIG. 1I, a thinning process is performed over the surface 114 of the substrate 110 until the seed layer 150 and the insulating layer 190 in the holes H are exposed, in accordance with some embodiments. The holes H penetrate through the substrate 110 after the thinning process, in accordance with some embodiments.

The thinning process includes a grinding process and/or a chemical mechanical polishing (CMP) process, in accordance with some embodiments. After the thinning process, a surface 152 of the seed layer 150, a surface 192 of the insulating layer 190, and the surface 114 of the substrate 110 are substantially level with each other, in accordance with some embodiments.

As shown in FIG. 1J, the seed layer 150 and the insulating layer 190 in the holes H and the substrate 110 adjacent to the holes H are partially removed from the surface 114 of the substrate 110 to widen the holes H adjacent to the surface 114, in accordance with some embodiments. After the removal process, each hole H has an enlarged portion H3, in accordance with some embodiments. The enlarged portion H3 is able to improve the step coverage uniformity of a seed layer subsequently deposited in the holes H from the surface 114, in accordance with some embodiments.

In this step, each hole H has the enlarged portions H1 and H3 and the neck portion H2 between the enlarged portions H1 and H3, in accordance with some embodiments. The enlarged portion H3 has a width $W_{H3}$ increasing in a direction V2 away from the wiring structure 130, in accordance with some embodiments.

The width $W_{H3}$ ranges from about 3.5 µm to about 100 µm, in accordance with some embodiments. The width $W_{H3}$ is greater than the width $W_{H1}$, in accordance with some embodiments. In some embodiments, a second difference between a maximum value and a minimum value of the width $W_{H3}$ ranges from about 0.5 µm to about 50 µm.

In some embodiments, a difference between the first difference (between the maximum value and the minimum value of the width $W_{H1}$) and the second difference (between the maximum value and the minimum value of the width $W_{H3}$) ranges from about 0.1 µm to about 50 µm. The enlarged portion H3 is wider than the neck portion H2, in accordance with some embodiments. That is, an average width of the enlarged portion H3 is greater than the width $W_{H2}$ of the neck portion H2, in accordance with some embodiments.

The enlarged portion H3 has sloped inner walls H3a, in accordance with some embodiments. The sloped inner walls H3a are, for example, planar surfaces. Each inner wall H2a is connected between the corresponding inner wall H1a and the corresponding sloped inner wall H3a, in accordance with some embodiments. The inner wall H2a is steeper than the corresponding sloped inner wall H3a with respect to the surface 114 of the substrate 110, in accordance with some embodiments. The sloped inner wall H3a is substantially level with (or coplanar with) an end surface 154 of the seed layer 150, in accordance with some embodiments.

In some embodiments, an angle θ2 between the steep inner wall H2a and the sloped inner wall H3a ranges from about 5° to about 85°. If the angle θ2 is less than 5°, the edge 116 of the substrate 110 may be too sharp to be uniformly covered by a seed layer formed in a subsequent process. If the angle θ2 is greater than 85°, the edge 118 of the substrate 110 may be too sharp to be uniformly covered by a seed layer formed in a subsequent process.

The hole H has a length $L_H$ ranges from about 10 µm to about 2000 µm, in accordance with some embodiments. The enlarged portion H1 has a length L1 ranging from about 2 µm to about 10 µm, in accordance with some embodiments. Since the dielectric structure 132 is made of a material different from that of the substrate 110, which improves an etching selection ratio of the dielectric structure 132 to the substrate 110, in accordance with some embodiments. Therefore, the length L1 of the enlarged portion H1 is less than or equal to a thickness T130 of the wiring structure 130, in accordance with some embodiments. The thickness T130 ranges from about 7 µm to about 13 µm, in accordance with some embodiments.

The neck portion H2 has a length L2 ranging from about 1 µm to about 1990 µm, in accordance with some embodiments. The enlarged portion H3 has a length L3 ranging from about 2 µm to about 10 µm, in accordance with some embodiments. The length $L_H$ of the hole H is substantially equal to a sum of the lengths L1, L2 and L3, in accordance with some embodiments. The length L2 is greater than the length L3, in accordance with some embodiments. The length L3 is greater than the length L1, in accordance with some embodiments.

The removal process includes an etching process, such as an anisotropic etching process (e.g., a dry etching process). The dry etching process includes a sputtering process, such as an inductively coupled plasma (ICP) sputtering process, in accordance with some embodiments.

The source power of the ICP sputtering process ranges from about 1000 W to about 1800 W, in accordance with some embodiments. The bias power of the ICP sputtering process ranges from about 1000 W to about 1800 W, in accordance with some embodiments. The ICP sputtering process uses process gases, such as $CF_4$, $CHF_3$, Ar, $NF_3$, $O_2$, and/or $N_2$, in accordance with some embodiments.

The flow rate of $CF_4$ ranges from about 0.1 sccm to about 200 sccm, in accordance with some embodiments. The flow rate of $CHF_3$ ranges from about 0.1 sccm to about 150 sccm, in accordance with some embodiments. The flow rate of Ar ranges from about 0.1 sccm to about 120 sccm, in accordance with some embodiments. The flow rate of $O_2$ ranges from about 0.1 sccm to about 110 sccm, in accordance with some embodiments. The flow rate of $N_2$ ranges from about 0.1 sccm to about 90 sccm, in accordance with some embodiments. The flow rate of $NF_3$ ranges from about 0.1 sccm to about 80 sccm, in accordance with some embodiments.

As shown in FIG. 1K, a seed layer 220 is formed over the surface 114 of the substrate 110 and the seed layer 150 and the insulating layer 190 in the holes H, in accordance with some embodiments. The seed layer 220 conformally covers the surface 114, the sloped inner walls H3a of the enlarged portions H3, the end surface 154 of the seed layer 150, and an end surface 194 of the insulating layer 190, in accordance with some embodiments.

The formation of the enlarged portions H3 improves the step coverage uniformity of the seed layer 220 deposited in the holes H, in accordance with some embodiments. The seed layer 220 has a thickness T220 ranging from about 0.3 μm to about 1 μm, in accordance with some embodiments. The seed layer 220 is made of a conductive material, such as metal or alloys thereof (e.g., titanium, gold, and/or copper), in accordance with some embodiments.

In some embodiments, the seed layer 220 is a single-layered structure. In some other embodiments, the seed layer 220 is a multi-layered structure including layers, which are made of different materials. For example, the seed layer 220 includes a titanium layer (not shown) and a gold layer (not shown) over the titanium layer. The seed layer 220 is formed using a deposition process, such as a plasma sputtering process, in accordance with some embodiments.

As shown in FIG. 1L, a mask layer 230 is formed over the seed layer 220, in accordance with some embodiments. The mask layer 230 has trenches 232, in accordance with some embodiments. The trenches 232 expose portions of the seed layer 220, in accordance with some embodiments.

In some embodiments, the trenches 232 have different widths. In some other embodiments, the trenches 232 have substantially the same width. The widths of the trenches 232 are selected according to requirements, in accordance with some embodiments. The mask layer 230 is made of a polymer material, such as a photoresist material, in accordance with some embodiments.

As shown in FIG. 1L, conductive lines 242, 244, and 246 are formed in the trenches 232 and over the seed layer 220 exposed by the trenches 232, in accordance with some embodiments. The conductive lines 242, 244, and 246 together form a wiring layer 240, in accordance with some embodiments.

The conductive lines 242, 244, and 246 are made of a conductive material, such as metal (e.g., copper, aluminum, gold, silver, tungsten, titanium, cobalt, or ruthenium) or alloys thereof, in accordance with some embodiments. The conductive lines 242, 244, and 246 are formed by a plating process, such as an electroplating process, in accordance with some embodiments.

As shown in FIG. 1M, the mask layer 230 is removed, in accordance with some embodiments. As shown in FIG. 1M, a mask layer 250 is formed over portions of the seed layer 220, in accordance with some embodiments. The portions of the seed layer 220 includes a first portion in the holes H, a second portion between the holes H, and a third portion adjacent to the holes H, in accordance with some embodiments. The mask layer 250 is made of a polymer material, such as a photoresist material, in accordance with some embodiments.

As shown in FIG. 1M, the seed layer 220, which is not covered by the conductive lines 242, 244, and 246 and the mask layer 250, is removed, in accordance with some embodiments. The removal process includes an etching process, such as a dry etching process or a wet etching process, in accordance with some embodiments. As shown in FIG. 1N, the mask layer 250 is removed, in accordance with some embodiments.

As shown in FIG. 1O, the substrate 110 is flipped over and bonded to a glue layer 260 over a carrier substrate 270, in accordance with some embodiments. The glue layer 260 is made of an insulating adhesive material, such as a polymer material, in accordance with some embodiments.

The carrier substrate 270 is used to support the substrate 110, in accordance with some embodiments. The carrier substrate 270 is made of metal, glass, semiconductor material (e.g., silicon), polymer, the like, or another suitable material, in accordance with some embodiments.

As shown in FIG. 1P, the insulating layer 190 and the carrier substrate 210 are removed, in accordance with some embodiments. As shown in FIG. 1P, a mask layer 280 is formed over the seed layer 150 and the wiring structure 130, in accordance with some embodiments. The mask layer 280 has through holes 282, in accordance with some embodiments.

The through holes 282 are in the holes H and expose portions of the seed layer 220 in the holes H, in accordance with some embodiments. The mask layer 280 is made of a polymer material, such as a photoresist material, in accordance with some embodiments.

As shown in FIG. 1Q, the portions of the seed layer 220 exposed by the through holes 282 are removed through the through holes 282, in accordance with some embodiments. The removal process includes an etching process, such as a dry etching process, in accordance with some embodiments.

As shown in FIG. 1R, the mask layer 280 is removed, in accordance with some embodiments. As shown in FIG. 1R, the glue layer 260 and the carrier substrate 270 are removed, in accordance with some embodiments. The seed layers 150 and 220 together form a seed layer S, in accordance with some embodiments. In this step, a semiconductor device structure 100 is substantially formed, in accordance with some embodiments. The holes H penetrate through the chip structure C, in accordance with some embodiments.

The wiring layers 170 and 240 are electrically connected with each other through the seed layers 150 and 220, in accordance with some embodiments. Since the formation of the enlarged portions H1 and H3 improves the step coverage uniformity of the seed layers 150 and 220 in the holes H, the electrical connection property between the wiring layers 170 and 240 is improved, in accordance with some embodiments. Therefore, the performance of the semiconductor device structure 100 is improved, in accordance with some embodiments.

Figures 1, 1R, 2, 3, 4, 5, 6, 7, 8, 9:
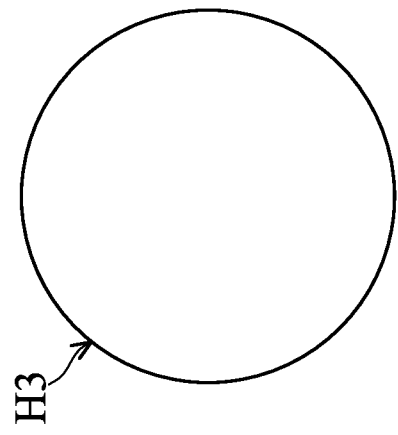
Figures 1, 1R, 2, 3, 4, 5, 6, 7, 8, 9, 10, 11:
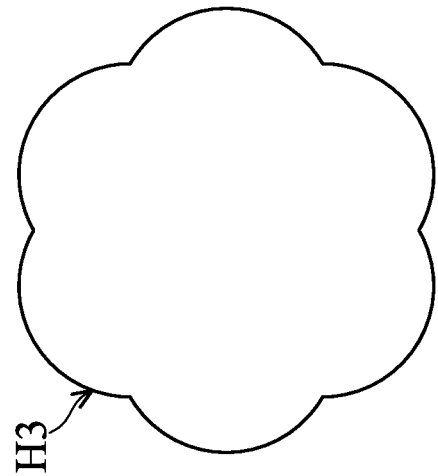
Figures 1, 1R, 2, 3, 4, 5, 6, 7, 8:
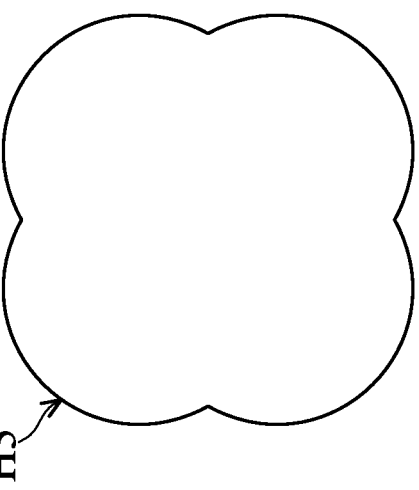
Figures 1, 1R, 2, 3, 4, 5, 6, 7, 8, 9, 10:
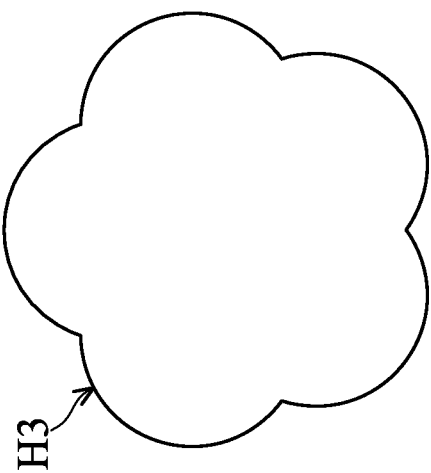
Figure 2:
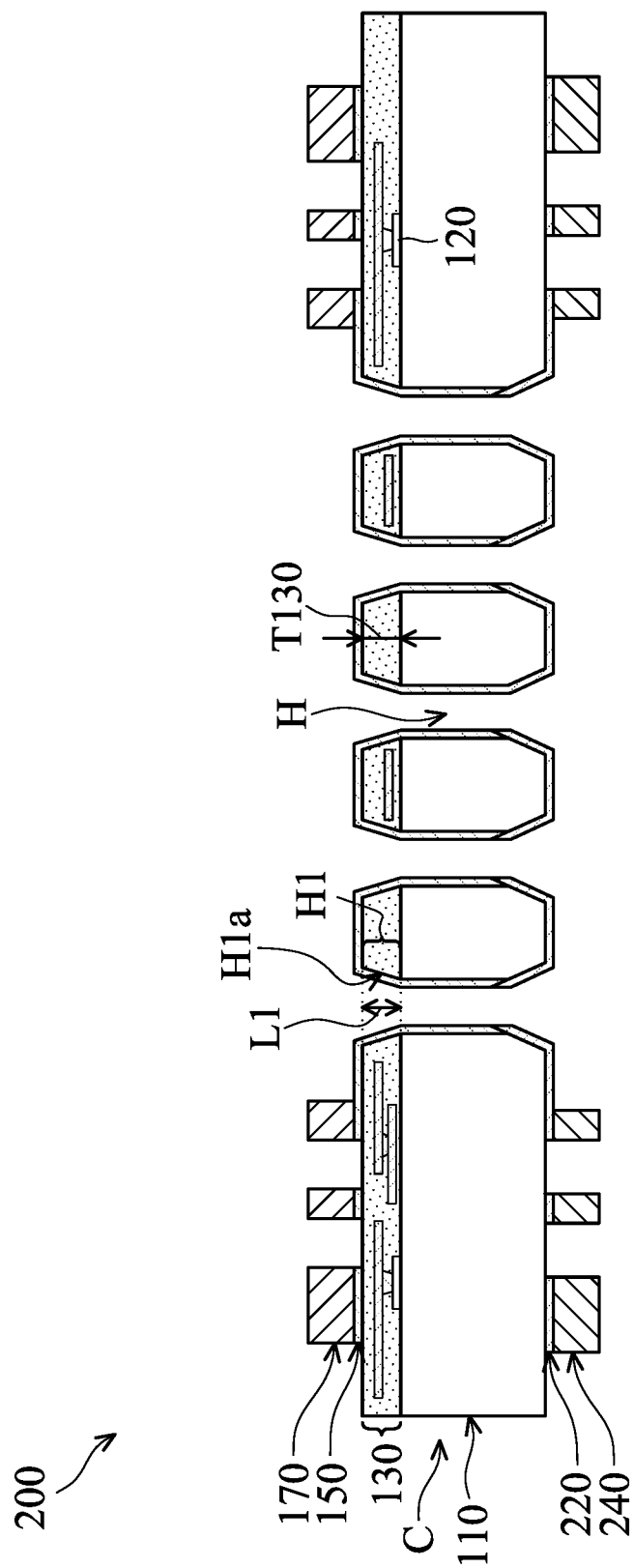
Figure 3:
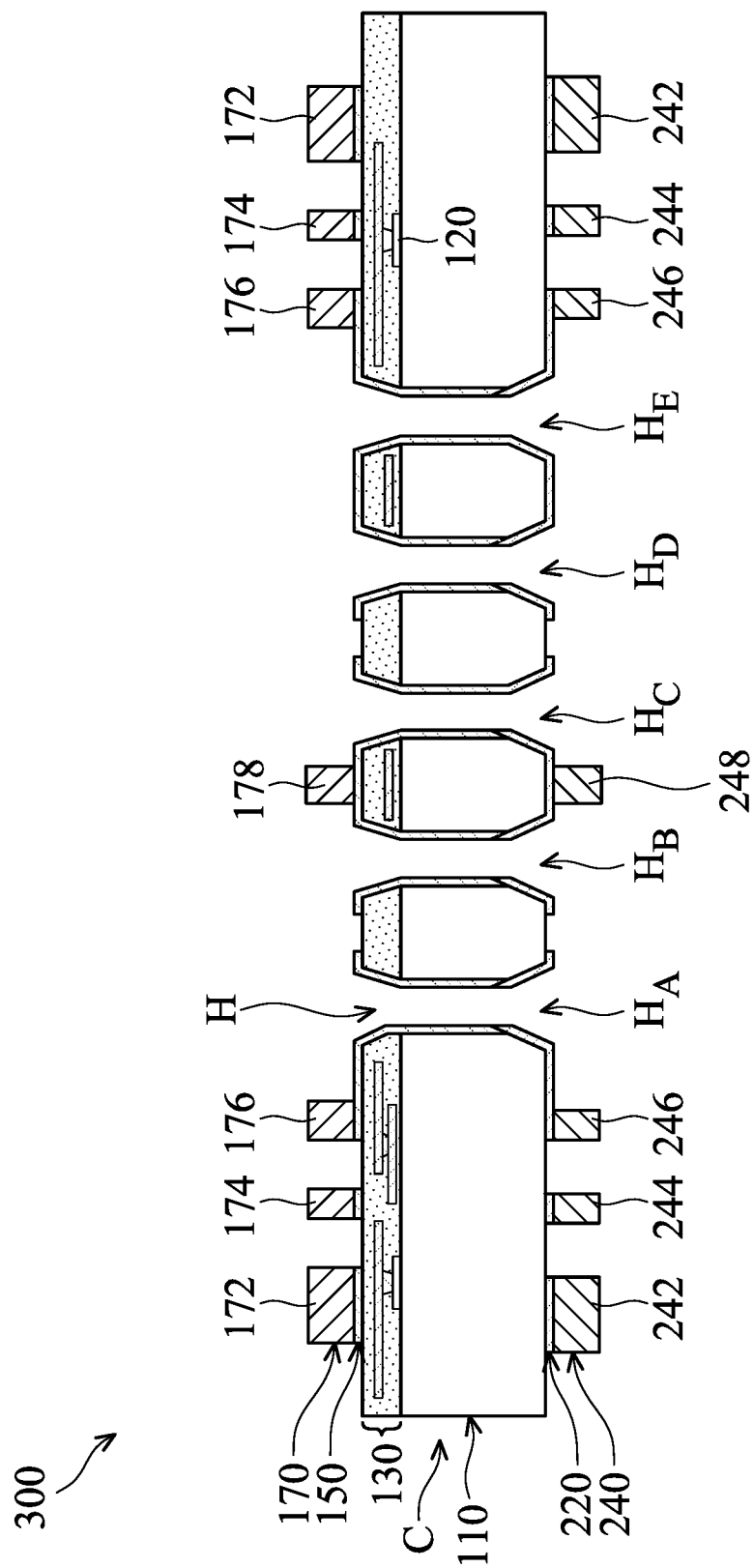
Figure 4:
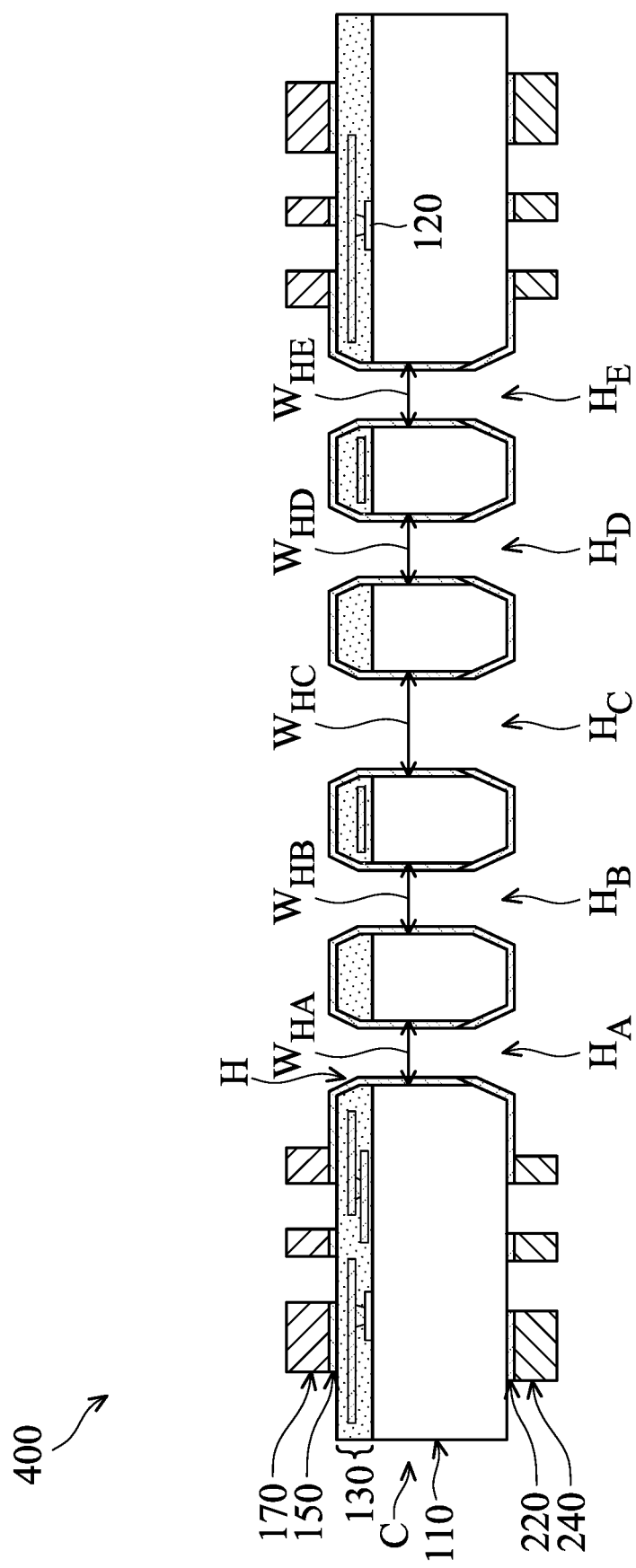
Figure 5:
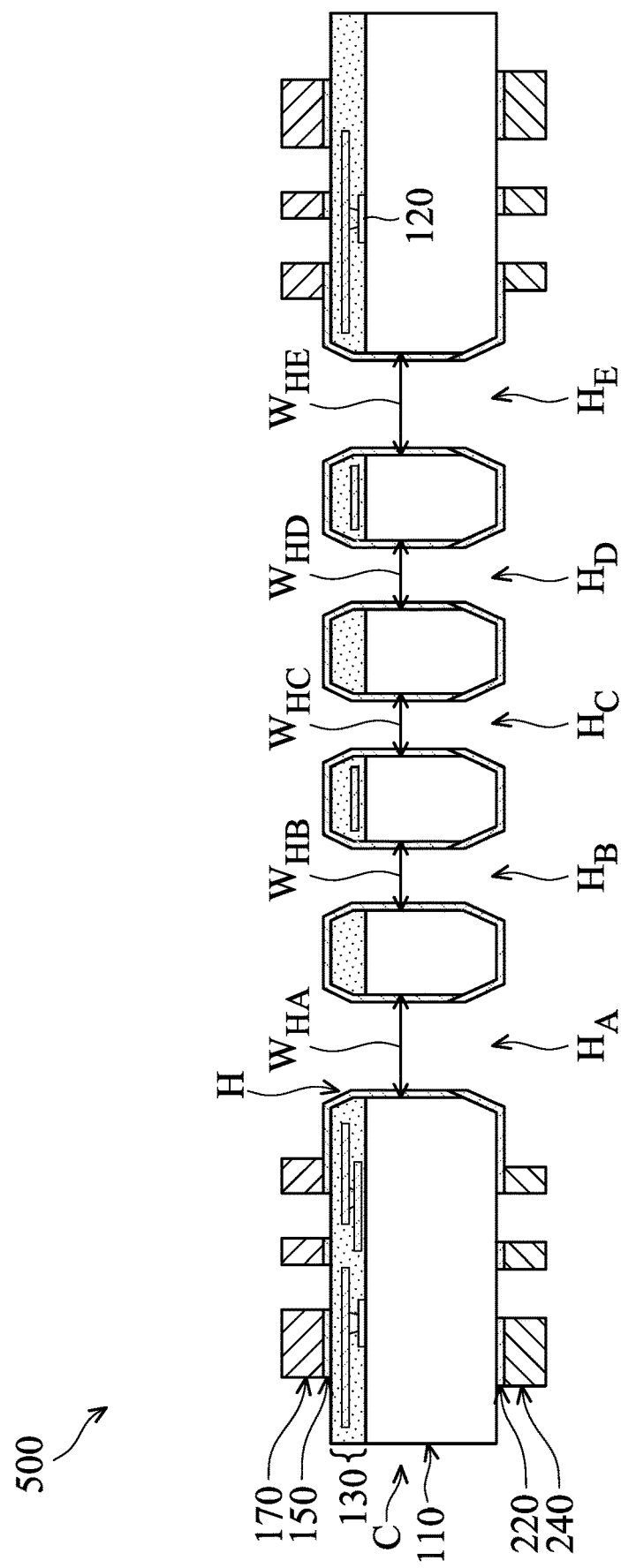
Figure 6:
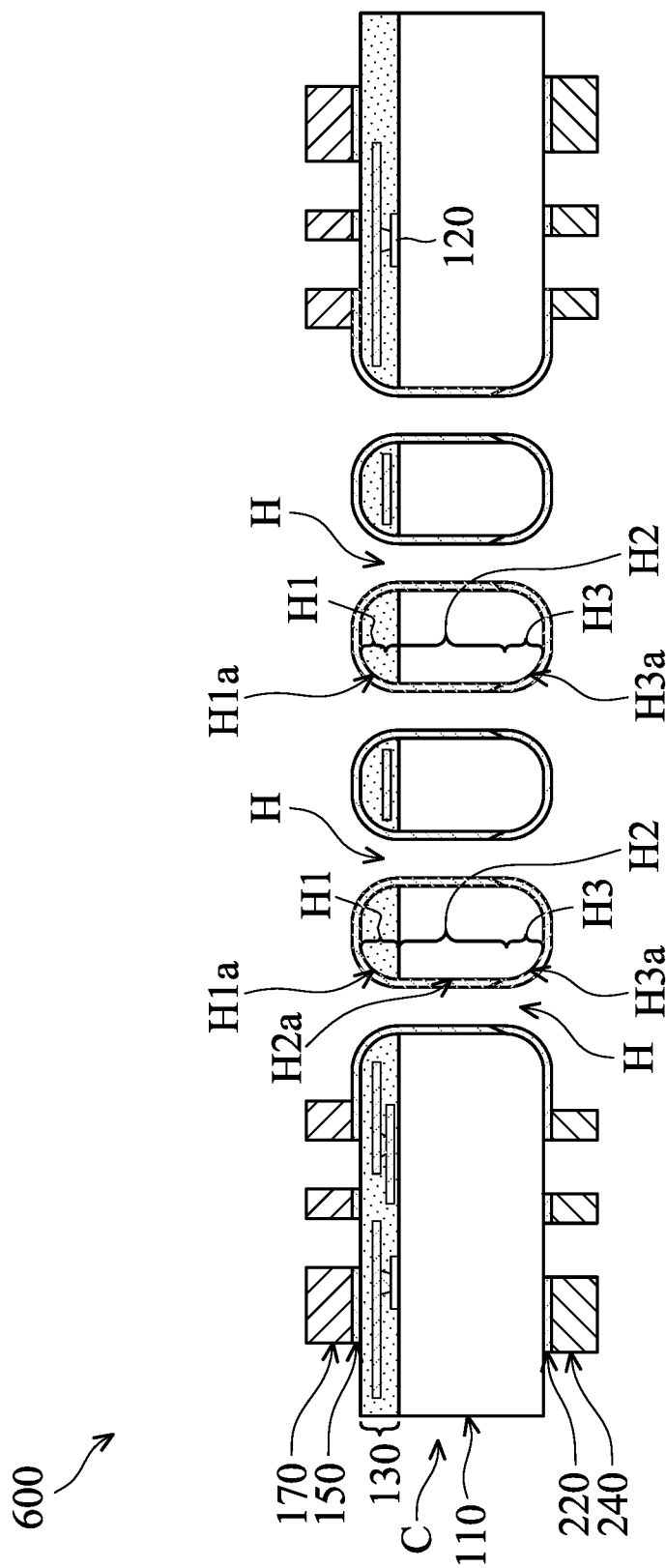
Figure 7:
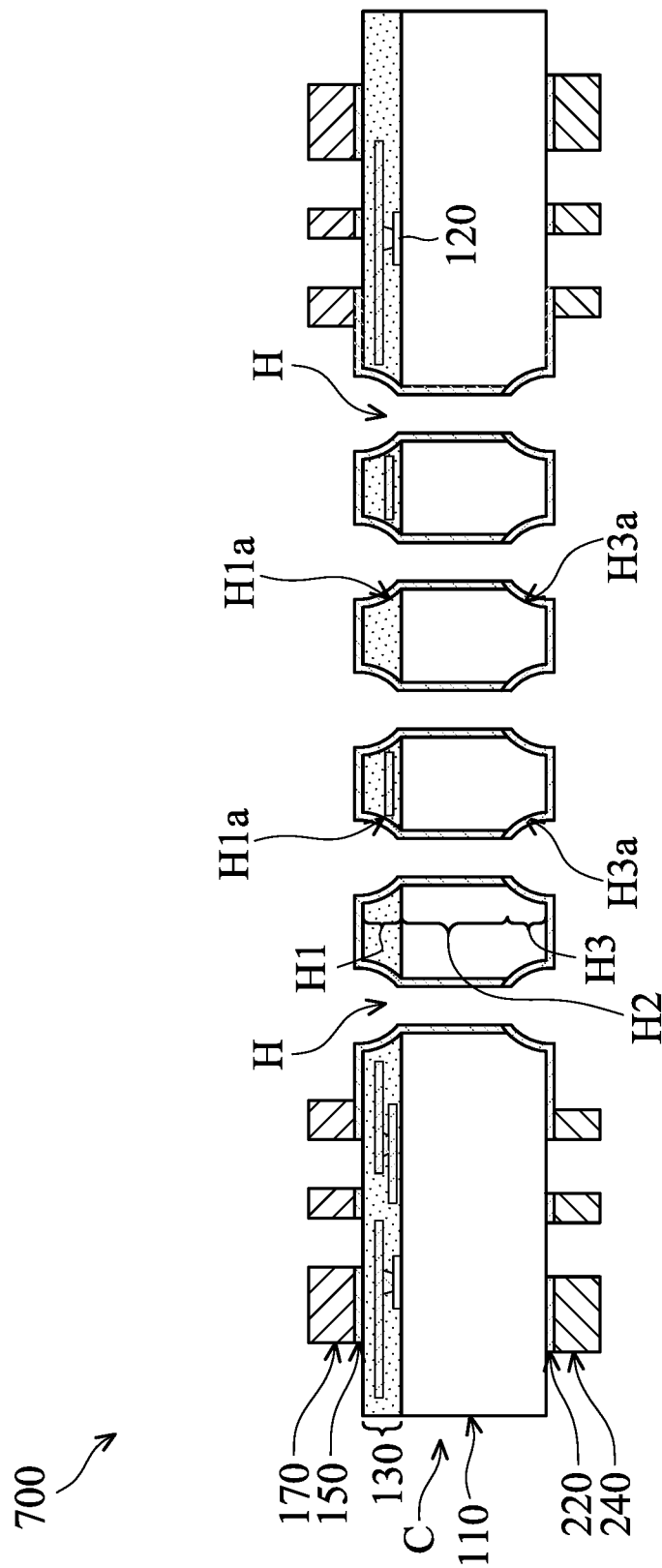
Figure 8:
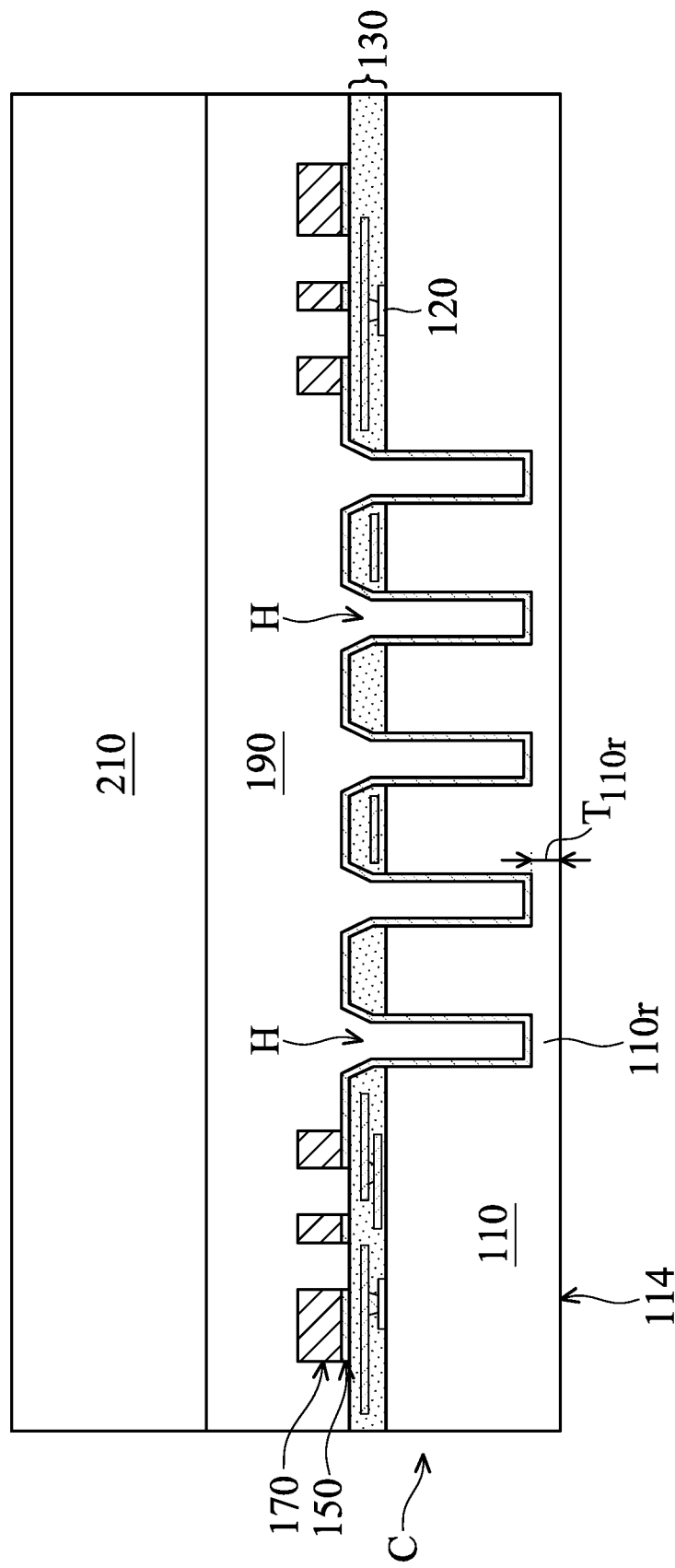

FIG. 1R-1 is a top view of the enlarged portion H1 and the neck portion H2 of the hole H of the chip structure C of the semiconductor device structure 100 in a region R of FIG. 1R, in accordance with some embodiments. As shown in FIGS. 1R and 1R-1, the enlarged portion H1 has a substantially square shape with rounded corners H1b, in accordance with some embodiments. The radius $R_{H1}$ of curvature of the rounded corner H1b ranges from about 0.01 inch to about 0.9 inch, in accordance with some embodiments.

The enlarged portion H1 and the neck portion H2 have a same shape, in accordance with some embodiments. The neck portion H2 also has a substantially square shape with rounded corners, in accordance with some embodiments.

In some other embodiments, as shown in FIG. 1R-2, the enlarged portion H1 has a substantially rectangular shape with rounded corners H1b, and the neck portion H2 also has a substantially rectangular shape with rounded corners, in accordance with some embodiments.

In still other embodiments, as shown in FIG. 1R-3, the enlarged portion H1 has a substantially round shape, and the neck portion H2 also has a round shape, in accordance with some embodiments. In some other embodiments, as shown in FIG. 1R-4, the enlarged portion H1 has a substantially oval shape, and the neck portion H2 also has a substantially oval shape, in accordance with some embodiments. In some embodiments, as shown in FIG. 1R-5, the enlarged portion H1 has a substantially capsule shape, and the neck portion H2 also has a substantially capsule shape, in accordance with some embodiments.

In some other embodiments, the enlarged portion H1 and the neck portion H2 have a polygonal shape. For example, as shown in FIG. 1R-6, the enlarged portion H1 and the neck portion H2 have a substantially pentagon shape, in accordance with some embodiments. As shown in FIG. 1R-7, the enlarged portion H1 and the neck portion H2 have a substantially hexagonal shape.

FIG. 1R-8 is a bottom view of the enlarged portion H3 of the hole H of the chip structure C of the semiconductor device structure 100 in a region R of FIG. 1R, in accordance with some embodiments. As shown in FIGS. 1R and 1R-8, the enlarged portion H3 has a flower-like shape having four petals, in accordance with some embodiments. In some embodiments, the shape of the enlarged portion H1 is different from the shape of the enlarged portion H3.

In some other embodiments, the shape of the enlarged portion H1 is substantially the same as the shape of the enlarged portion H3. For example, the enlarged portion H1 has a substantially round shape (as shown in FIG. 1R-3), and the enlarged portion H3 has a substantially round shape (as shown in FIG. 1R-9). In some embodiments, the enlarged portion H3 has a flower-like shape having five petals (as shown in FIG. 1R-10) or a flower-like shape having six petals (as shown in FIG. 1R-11).

FIG. 2 is a cross-sectional view of a semiconductor device structure 200, in accordance with some embodiments. As shown in FIG. 2, the semiconductor device structure 200 is similar to the semiconductor device structure 100 of FIG. 1R, except that in the chip structure C of the semiconductor device structure 200, the length L1 of the enlarged portion H1 of the hole H is equal to the thickness T130 of the wiring structure 130, in accordance with some embodiments.

FIG. 3 is a cross-sectional view of a semiconductor device structure 300, in accordance with some embodiments. As shown in FIG. 3, the semiconductor device structure 300 is similar to the semiconductor device structure 100 of FIG. 1R, except that the holes H includes holes $H_A$, $H_B$, $H_C$, $H_D$, and $H_E$, and first portions of the seed layers 150 and 220 in the hole $H_A$, second portions of the seed layers 150 and 220 in the holes $H_B$ and $H_C$, and third portions of the seed layers 150 and 220 in the holes $H_D$ and $H_E$ are electrically insulated from each other, in accordance with some embodiments.

The wiring layer 170 of the semiconductor device structure 300 has a conductive line 178, in accordance with some embodiments. The conductive line 178 is over the seed layer 150 between the holes $H_B$ and $H_C$, in accordance with some embodiments. The conductive line 178 is electrically connected to the seed layers 150 and 220 in the holes $H_B$ and $H_C$, in accordance with some embodiments.

The wiring layer 240 of the semiconductor device structure 300 has a conductive line 248, in accordance with some embodiments. The conductive line 248 is over the seed layer 220 between the holes $H_B$ and $H_C$, in accordance with some embodiments. The conductive line 248 is electrically connected to the conductive line 178 through the second portions of the seed layers 150 and 220 in the holes $H_B$ and $H_C$, in accordance with some embodiments.

FIG. 4 is a cross-sectional view of a semiconductor device structure 400, in accordance with some embodiments. As shown in FIG. 4, the semiconductor device structure 400 is similar to the semiconductor device structure 100 of FIG. 1R, except that the holes H includes holes $H_A$, $H_B$, $H_C$, $H_D$, and HE, which have different widths, in accordance with some embodiments.

The width $W_{HC}$ of the hole $H_C$ is greater than the width $W_{HB}$ of the hole $H_B$, in accordance with some embodiments. The width $W_{HC}$ is greater than the width $W_{HD}$ of the hole $H_D$, in accordance with some embodiments. The width $W_{HB}$ is greater than the width $W_{HA}$ of the hole $H_A$, in accordance with some embodiments. The width $W_{HD}$ is greater than the width $W_{HE}$ of the hole $H_E$, in accordance with some embodiments.

FIG. 5 is a cross-sectional view of a semiconductor device structure 500, in accordance with some embodiments. As shown in FIG. 5, the semiconductor device structure 500 is similar to the semiconductor device structure 100 of FIG. 1R, except that the holes H includes holes $H_A$, $H_B$, $H_C$, $H_D$, and $H_E$, which have different widths, in accordance with some embodiments.

The width $W_{HC}$ of the hole $H_C$ is less than the width $W_{HB}$ of the hole $H_B$, in accordance with some embodiments. The width $W_{HC}$ is less than the width $W_{HD}$ of the hole $H_D$, in accordance with some embodiments. The width $W_{HB}$ is less than the width $W_{HA}$ of the hole $H_A$, in accordance with some embodiments. The width $W_{HD}$ is less than the width $W_{HE}$ of the hole $H_E$, in accordance with some embodiments.

FIG. 6 is a cross-sectional view of a semiconductor device structure 600, in accordance with some embodiments. As shown in FIG. 6, the semiconductor device structure 600 is similar to the semiconductor device structure 100 of FIG. 1R, except that in the chip structure C of the semiconductor device structure 600, the sloped inner walls H1a of the enlarged portion H1 and the sloped inner walls H3a of the enlarged portion H3 of each hole H are convex curved surfaces, in accordance with some embodiments.

FIG. 7 is a cross-sectional view of a semiconductor device structure 700, in accordance with some embodiments. As shown in FIG. 7, the semiconductor device structure 700 is similar to the semiconductor device structure 100 of FIG. 1R, except that in the chip structure C of the semiconductor device structure 700, the sloped inner walls H1a of the enlarged portion H1 and the sloped inner walls H3a of the enlarged portion H3 of each hole H are concave curved surfaces, in accordance with some embodiments.

FIG. 8 is a cross-sectional view of a stage of a process for forming a semiconductor device structure, in accordance with some embodiments. As shown in FIG. 8, after the step of FIG. 1H, a thinning process is performed over the surface 114 of the substrate 110, in accordance with some embodiments.

After the thinning process, a portion 110r of the substrate 110 is remained under the holes H, in accordance with some embodiments. The portion 110r has a thickness $T_{110r}$ ranging from about 20 μm to about 50 μm, in accordance with some embodiments. The thinning process includes a grinding process, in accordance with some embodiments.

Thereafter, as shown in FIG. 1J, the portion 110r, the seed layer 150 and the insulating layer 190 in the holes H, and the substrate 110 adjacent to the holes H are partially removed from the surface 114 of the substrate 110, in accordance with some embodiments. The removal process includes an etching process, such as an anisotropic etching process (e.g., a dry etching process). The dry etching process includes a sputtering process, such as an inductively coupled plasma (ICP) sputtering process, in accordance with some embodiments.

The source power of the ICP sputtering process ranges from about 1000 W to about 1800 W, in accordance with some embodiments. The bias power of the ICP sputtering process ranges from about 1000 W to about 1800 W, in accordance with some embodiments. The ICP sputtering process uses process gases, such as $CF_4$, $CHF_3$, Ar, $NF_3$, $O_2$, and/or $N_2$, in accordance with some embodiments.

The flow rate of $CF_4$ ranges from about 0.1 sccm to about 200 sccm, in accordance with some embodiments. The flow rate of $CHF_3$ ranges from about 0.1 sccm to about 150 sccm, in accordance with some embodiments. The flow rate of Ar ranges from about 0.1 sccm to about 120 sccm, in accordance with some embodiments. The flow rate of $O_2$ ranges from about 0.1 sccm to about 110 sccm, in accordance with some embodiments. The flow rate of $N_2$ ranges from about 0.1 sccm to about 90 sccm, in accordance with some embodiments. The flow rate of $NF_3$ ranges from about 0.1 sccm to about 80 sccm, in accordance with some embodiments.

Processes and materials for forming the semiconductor device structures 200, 300, 400, 500, 600, and 700 may be similar to, or the same as, those for forming the semiconductor device structure 100 described above.

In accordance with some embodiments, semiconductor device structures and methods for forming the same are provided. The methods (for forming the semiconductor device structure) remove edge portions of a substrate adjacent to through holes to widen openings of the through holes so as to improve the step coverage uniformity of seed layers deposited in the through holes from top and bottom surfaces of the substrate. The through hole has an hourglass shape, which has a smaller aperture at middle and lager apertures near the top and bottom surfaces of the substrate. The methods form wiring layers over the seed layers over the top and bottom surfaces of the substrate, and the wiring layers are electrically connected with each other through the seed layers in the through holes. The electrical connection property between the wiring layers is improved by the improved step coverage uniformity of the seed layers in the through holes. Therefore, the performance of the semiconductor device structures is improved.

In accordance with some embodiments, a method for forming a semiconductor device structure is provided. The method includes providing a chip structure including a substrate and a wiring structure over a first surface of the substrate. The chip structure has a hole penetrating through the wiring structure and extending into the substrate. The method includes removing a first portion of the wiring structure adjacent to the hole to widen a second portion of the hole in the wiring structure. The second portion has a first width increasing in a first direction away from the substrate. The method includes forming a first seed layer over the wiring structure and in the hole. The method includes thinning the substrate from a second surface of the substrate until the first seed layer in the hole is exposed. The second surface is opposite to the first surface, and the hole penetrates through the substrate after thinning the substrate. The method includes forming a second seed layer over the second surface of the substrate and the first seed layer in the hole.

In accordance with some embodiments, a method for forming a semiconductor device structure is provided. The method includes providing a chip structure including a substrate and a wiring structure over a first surface of the substrate. The chip structure has a hole penetrating through the wiring structure and extending into the substrate. The method includes widening an opening of the hole in the wiring structure. The method includes depositing a first seed layer over the wiring structure and in the hole. The method includes thinning the substrate from a second surface of the substrate. The second surface is opposite to the first surface, and the hole does not penetrate through the substrate after thinning the substrate. The method includes partially removing the substrate and the first seed layer in the hole from the second surface. The hole penetrates through the substrate and has a first enlarged portion close to the second surface after partially removing the substrate. The method includes forming a second seed layer over the second surface of the substrate and in the hole.

In accordance with some embodiments, a semiconductor device structure is provided. The semiconductor device structure includes a chip structure including a substrate and a wiring structure over a first surface of the substrate. The chip structure has a hole penetrating through the wiring structure and the substrate, the hole has a first enlarged portion, a second enlarged portion, and a neck portion between the first enlarged portion and the second enlarged portion, the first enlarged portion is wider than the neck portion, and the second enlarged portion is wider than the neck portion. The semiconductor device structure includes a first seed layer over the wiring structure, a first inner wall of the first enlarged portion, and a second inner wall of the neck portion. The semiconductor device structure includes a second seed layer over a second surface of the substrate, a third inner wall of the second enlarged portion, and the first seed layer over the second inner wall of the neck portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

providing a chip structure comprising a substrate and a wiring structure over a first surface of the substrate, wherein the chip structure has a hole penetrating through the wiring structure and extending into the substrate;

removing a first portion of the wiring structure adjacent to the hole to widen a second portion of the hole in the wiring structure, wherein the second portion has a first width increasing in a first direction away from the substrate;

forming a first seed layer over the wiring structure and in the hole;

thinning the substrate from a second surface of the substrate until the first seed layer in the hole is exposed, wherein the second surface is opposite to the first surface, and the hole penetrates through the substrate after thinning the substrate; and forming a second seed layer over the second surface of the substrate and the first seed layer in the hole, wherein the second seed layer is in direct contact with the first seed layer.

2. The method for forming the semiconductor device structure as claimed in claim 1, further comprising:
forming an insulating layer over the first seed layer and in the hole before thinning the substrate, wherein the thinning of the substrate is performed until the first seed layer and the insulating layer in the hole are exposed, and the second seed layer is further formed over the insulating layer in the hole; and
removing the insulating layer after forming the second seed layer.

3. The method for forming the semiconductor device structure as claimed in claim 2, further comprising:
removing the second seed layer originally formed over the insulating layer in the hole after removing the insulating layer.

4. The method for forming the semiconductor device structure as claimed in claim 1, wherein the second portion of the hole has a length less than or equal to a thickness of the wiring structure in a cross-sectional view of the chip structure.

5. The method for forming the semiconductor device structure as claimed in claim 1, wherein the removing of the first portion of the wiring structure adjacent to the hole and the forming of the first seed layer over the wiring structure and in the hole are performed in-situ.

6. The method for forming the semiconductor device structure as claimed in claim 1, further comprising:
partially removing the first seed layer in the hole and the substrate adjacent to the hole from the second surface of the substrate to widen a third portion of the hole adjacent to the second surface after thinning the substrate from the second surface of the substrate and before forming the second seed layer over the second surface of the substrate and the first seed layer in the hole.

7. The method for forming the semiconductor device structure as claimed in claim 6, wherein the third portion of the hole has a second width increasing in a second direction away from the wiring structure after partially removing the first seed layer in the hole and the substrate adjacent to the hole from the second surface of the substrate.

8. The method for forming the semiconductor device structure as claimed in claim 6, wherein the partially removing of the first seed layer in the hole and the substrate adjacent to the hole from the second surface of the substrate comprises:
performing an anisotropic etching process over the second surface of the substrate.

9. The method for forming the semiconductor device structure as claimed in claim 1, further comprising:
forming a first conductive line and a second conductive line over the first seed layer over the wiring structure before thinning the substrate; and
removing the first seed layer between the first conductive line and the second conductive line.

10. The method for forming the semiconductor device structure as claimed in claim 9, further comprising:
forming a third conductive line and a fourth conductive line over the second seed layer over the second surface of the substrate; and
removing the second seed layer between the third conductive line and the fourth conductive line.

11. A method for forming a semiconductor device structure, comprising:
providing a chip structure comprising a substrate and a wiring structure over a first surface of the substrate, wherein the chip structure has a hole penetrating through the wiring structure and extending into the substrate;
partially removing the wiring structure adjacent to the hole to widen the hole in the wiring structure, wherein the hole has a first enlarged portion and a neck portion after partially removing the wiring structure adjacent to the hole, and the first enlarged portion is wider than the neck portion;
forming a first seed layer over the wiring structure and in the hole;
thinning the substrate from a second surface of the substrate until the first seed layer in the hole is exposed, wherein the second surface is opposite to the first surface, and the hole penetrates through the substrate after thinning the substrate; and
partially removing the substrate and the first seed layer in the hole from the second surface; and
forming a second seed layer over the second surface of the substrate and in the hole, wherein the first seed layer has a first portion and a second portion, the first portion is covered by the second seed layer, the second portion is not covered by the second seed layer, and the first portion is thinner than the second portion.

12. The method for forming the semiconductor device structure as claimed in claim 11, wherein after partially removing the substrate and the first seed layer in the hole from the second surface, the hole has the first enlarged portion, a second enlarged portion, and the neck portion between the first enlarged portion and the second enlarged portion, and the second enlarged portion is wider than the neck portion.

13. The method for forming the semiconductor device structure as claimed in claim 12, wherein the first enlarged portion has a first inner wall, the neck portion has a second inner wall, and the second inner wall is steeper than the first inner wall with respect to the first surface of the substrate.

14. The method for forming the semiconductor device structure as claimed in claim 13, wherein the second enlarged portion has a third inner wall, and the second inner wall is steeper than the third inner wall with respect to the second surface of the substrate.

15. The method for forming the semiconductor device structure as claimed in claim 14, wherein the second seed layer conformally covers the second surface of the substrate, the third inner wall of the second enlarged portion of the hole, and the first seed layer in the hole.

16. A method for forming a semiconductor device structure, comprising:
providing a chip structure comprising a substrate and a wiring structure over a first surface of the substrate, wherein the chip structure has a hole penetrating through the wiring structure and extending into the substrate;
partially removing the wiring structure adjacent to the hole to widen the hole in the wiring structure, wherein the hole has a first enlarged portion and a neck portion after partially removing the wiring structure adjacent to the hole, and the first enlarged portion is wider than the neck portion;
forming a first seed layer over the wiring structure and in the hole;

thinning the substrate from a second surface of the substrate until the first seed layer in the hole is exposed, wherein the second surface is opposite to the first surface, and the hole penetrates through the substrate after thinning the substrate; and forming a second seed layer over the second surface of the substrate and the first seed layer in the hole, wherein the hole has a first shape in a top view of the chip structure, the hole has a second shape in a bottom view of the chip structure, and the first shape is different from the second shape.

17. The method for forming the semiconductor device structure as claimed in claim 16, further comprising:

partially removing the substrate and the first seed layer in the hole from the second surface after thinning the substrate from the second surface of the substrate and before forming the second seed layer over the second surface of the substrate and the first seed layer in the hole.

18. The method for forming the semiconductor device structure as claimed in claim 17, wherein after partially removing the substrate and the first seed layer in the hole from the second surface, the hole has a first enlarged portion, a second enlarged portion, and a neck portion between the first enlarged portion and the second enlarged portion, the first enlarged portion is wider than the neck portion, and the second enlarged portion is wider than the neck portion.

19. The method for forming the semiconductor device structure as claimed in claim 18, wherein the first enlarged portion and the neck portion has a same shape in the top view of the chip structure.

20. The method for forming the semiconductor device structure as claimed in claim 19, wherein the first enlarged portion and the second enlarged portion has different shapes in the top view of the chip structure.

* * * * *